US011056167B2

(12) United States Patent
Ito et al.

(10) Patent No.: US 11,056,167 B2
(45) Date of Patent: *Jul. 6, 2021

(54) APPARATUSES FOR REFRESHING MEMORY OF A SEMICONDUCTOR DEVICE

(71) Applicant: Micron Technology, Inc., Boise, ID (US)

(72) Inventors: Yutaka Ito, Tokyo (JP); Yoshifumi Mochida, Sagamihara (JP); Hiroei Araki, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/661,944

(22) Filed: Oct. 23, 2019

(65) Prior Publication Data
US 2020/0058346 A1 Feb. 20, 2020

Related U.S. Application Data

(63) Continuation of application No. 16/103,668, filed on Aug. 14, 2018, now Pat. No. 10,490,250.

(51) Int. Cl.
G11C 11/406 (2006.01)
G11C 11/408 (2006.01)

(52) U.S. Cl.
CPC ..... G11C 11/40611 (2013.01); G11C 11/4087 (2013.01)

(58) Field of Classification Search
CPC .......... G11C 11/40611; G11C 11/4087; G11C 29/76; G11C 11/40622
USPC ....................................... 365/222
See application file for complete search history.

(56) References Cited

U.S. PATENT DOCUMENTS

| 9,373,422 | B1* | 6/2016 | Kwean ................ G11C 29/808 |
| 9,721,643 | B2 | 8/2017 | Bains et al. |
| 2016/0211008 | A1 | 7/2016 | Benedict et al. |
| 2019/0189194 | A1* | 6/2019 | Kim ................ G11C 11/40618 |

* cited by examiner

Primary Examiner — Fernando Hidalgo
(74) Attorney, Agent, or Firm — Dorsey & Whitney LLP

(57) ABSTRACT

Disclosed herein is an apparatus that includes a memory cell array, a row hammer refresh circuit configured to generate a row hammer refresh address based on an access history of the memory cell array, a redundancy circuit configured to store a plurality of defective addresses of the memory cell array, and a row pre-decoder configured to skip a refresh operation on the row hammer refresh address when the row hammer refresh address matches any one of the plurality of defective addresses.

6 Claims, 14 Drawing Sheets

APPARATUSES FOR REFRESHING MEMORY OF A SEMICONDUCTOR DEVICE

CROSS-REFERENCE TO RELATED APPLICATION

This application is a continuation of U.S. patent application Ser. No. 16/103,668, filed Aug. 14, 2018. U.S. Pat. No. 10,490,250 issued Nov. 26. 2019. This application is incorporated by reference herein in its entirety and for all purposes.

BACKGROUND

Dynamic random access memory (DRAM) include volatile memory cells that may be used to store data. However, in order to maintain the stored data, the memory cells are periodically refreshed to restore the data being stored. The memory cells are typically refreshed by sequencing through groups of memory cells associated with respective refresh addresses. The refresh address may be generated internally, and the refresh operations for the memory cells corresponding to the refresh address performed in response to refresh commands.

Refreshing the memory cells consume power. In low power applications, reducing power consumption from refresh operations may be beneficial. Therefore, it may be desirable to have refresh operations that may have reduced power consumption.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the examples of the disclosure. Additionally, terms such as "couples" and "coupled" mean that two components may be directly or indirectly electrically coupled. Indirectly coupled may imply that two components are coupled through one or more intermediate components.

Figure 1:
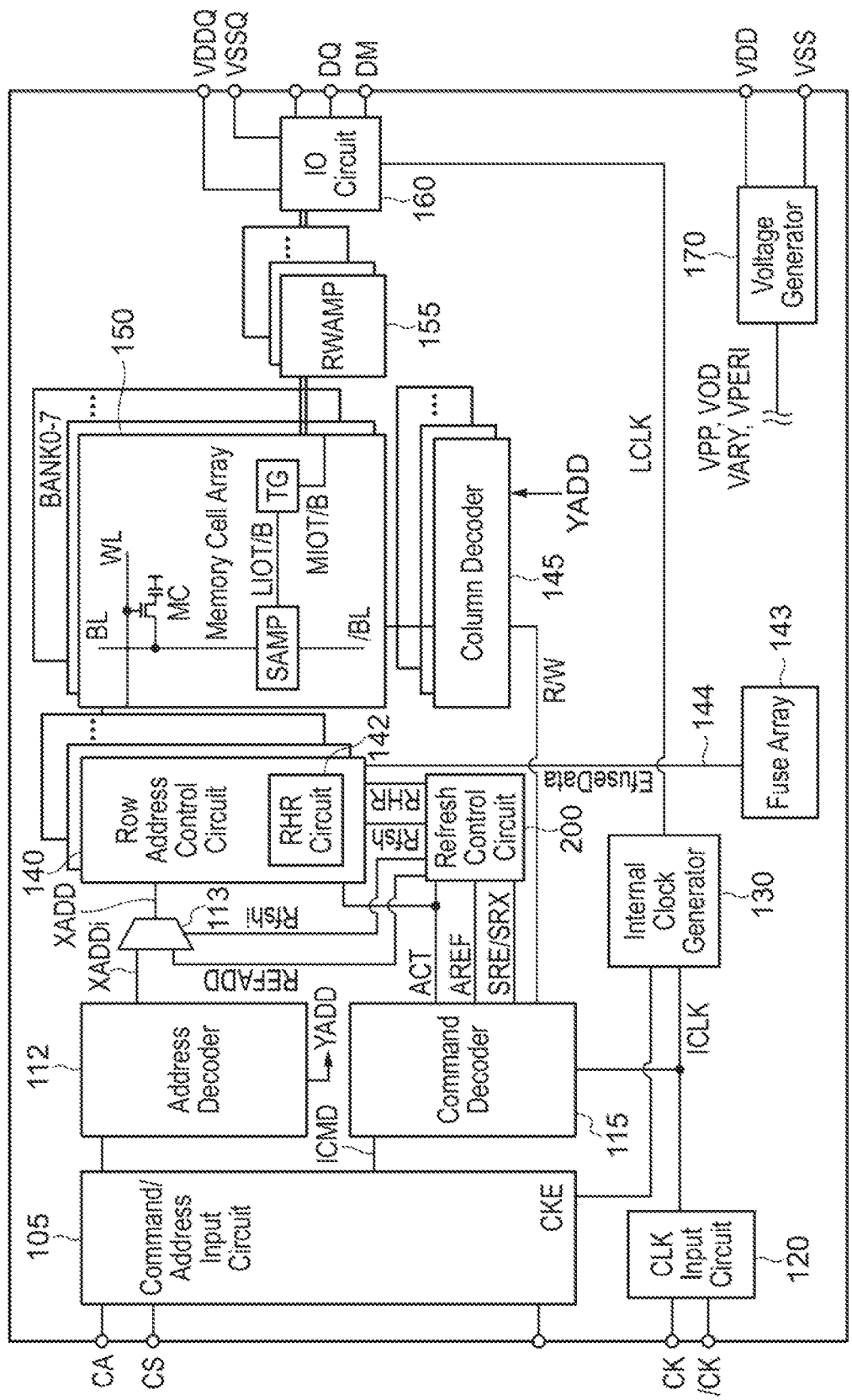
FIG. 1 is a block diagram of an apparatus according to an embodiment of the disclosure.

FIG. 1 is a block diagram of an apparatus according to an embodiment of the disclosure. The apparatus may include a semiconductor device 100, and will be referred as such. In some embodiments, the semiconductor device 100 may include, without limitation, a DRAM device, such as low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL and /BL, and a plurality of memory cells MC arranged at intersections of the plurality of word lines WL and the plurality of bit lines BL and /BL. The memory cells MC are volatile memory cells, requiring periodic refreshing in order to maintain the data stored in the memory array.

The selection of the word line WL is performed by a row address control circuit 140 and the selection of the bit line BL is performed by a column decoder 145. Sense amplifiers (SAMP) are located for their corresponding bit lines BL and /BL coupled to at least one respective local I/O line pair (LIOT/B), which is in turn coupled to at least one respective main I/O line pair (MIOT/B), via transfer gates (TG), which function as switches.

Figure 2:
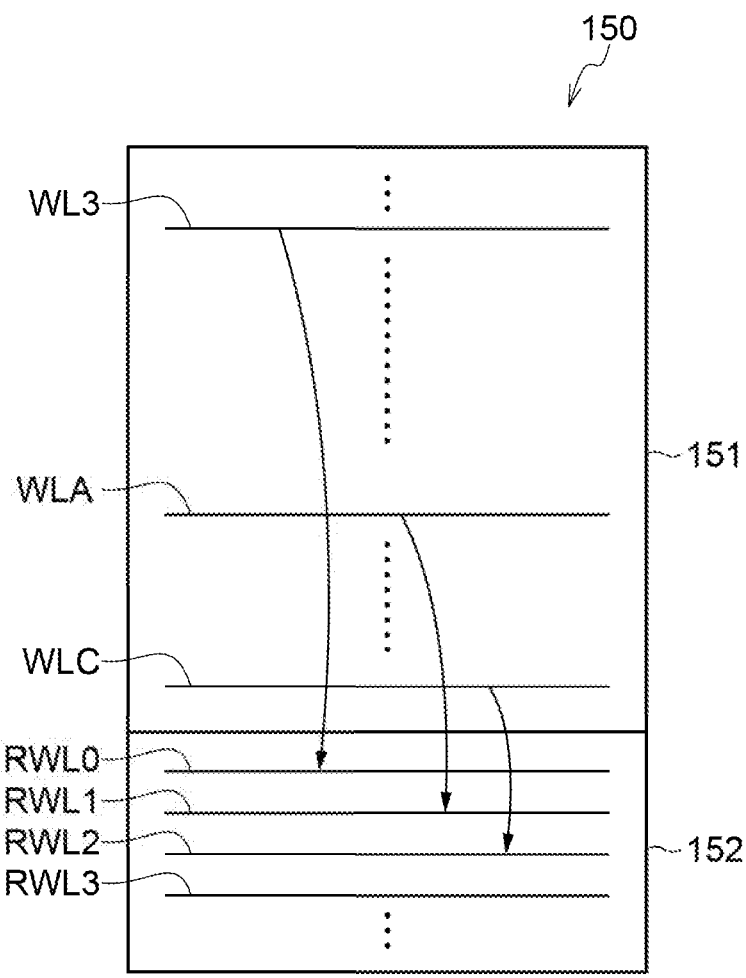
FIG. 2 is a schematic diagram of a memory array according to an embodiment of the disclosure.

As shown in FIG. 2, the memory array 150 may include a regular array 151 and a redundant array 152. The regular array 151 includes memory cells that are typically used to store data with the memory cells corresponding to respective memory addresses. The redundant array 152 includes memory cells that may be used to "repair" defective memory cells of the regular array 151. The memory cells may be configured as redundant rows of memory and redundant columns of memory. The redundant rows of memory may be used to repair rows of memory of the regular array 151, and the redundant columns of memory may be used to repair columns of memory of the regular array 151. The redundant memory are used to repair defective memory cells of the regular array 151 by having the memory addresses corresponding to the defect memory cells mapped to memory cells of the redundant array 152. As a result, when the memory address for the defective memory location is provided to the semiconductor device 100, the memory location in the redundant array 152 to which the memory address is mapped is accessed instead of the defective memory location in the regular array 151 corresponding to that memory address.

In the example shown in FIG. 2, word lines WL3, WLA, and WLC included in the regular array 151 are defective, and these word lines are respectively replaced by auxiliary word lines auxiliary word lines RWL0, RWL1, and RWL2 included in the redundant array 152. With this configuration, when row access to the word line WL3 is requested, the auxiliary word line RWL0 is selected instead of the word line WL3, and when row access to the word line WLA is requested, the auxiliary word line RWL1 is selected instead of the word line WLA, and when row access to the word line WLC is requested, the auxiliary word line RWL2 is selected instead of the word line WLC. Meanwhile, as described later, in a refresh operation, defective word lines WL3, WLA, and WLC are not selected and any substitute refresh operation on the word lines KWL0, RWL1, and RWL2 that are the replacing targets of these defective word lines is not performed. This feature is the same when a row hammer refresh operation is performed.

In the example shown in FIG. 2, while other word lines including the word line RWL3 are present in the redundant array 152, these word lines are unused. Any effective logical address is not assigned to the unused word lines included in the redundant array 152, and thus these unused word lines are not selected in actual row access. Also when a refresh operation is performed, the unused word lines included in the redundant array 152 are not selected and thus power consumption is reduced. Further, in the present embodiment, also when a row hammer refresh operation is performed, the unused word lines included in the redundant array 152 are not selected. For example, even when the word line RWL2 and the word line RWL3 included in the redundant array 152 are adjacent to each other physically and the frequency of access to the word line RWL2 exceeds a predetermined threshold, any row hammer refresh operation is not performed on the unused word line RWL3. On the other hand, when the word line RWL1 and the word line RWL2 included in the redundant array 152 are adjacent to each other physically and when the frequency of access to the word line RWL2 exceeds a predetermined threshold, a row hammer refresh operation is performed on the word line RWL1 being used.

The semiconductor device 100 may employ a plurality of external terminals, which include command/address terminals CA that are coupled to a command and address bus to receive commands and addresses. The plurality of external terminals further includes clock terminals CK and /CK to receive clock signals, data terminals DQ and data mask terminals DM, and power supply terminals VDD, VSS, VDDQ, and VSSQ.

The command/address terminals CA may be supplied with memory addresses, for example, from a memory controller. The memory addresses supplied to the command/address terminals CA are transferred, via a command address input circuit 105, to an address decoder 112. The address decoder 112 receives the memory addresses and supplies decoded row addresses XADDi to the row address control circuit 140 via a multiplexer 113, and supplies decoded column addresses YADD to the column decoder 145.

The command/address terminals CA may further be supplied with commands from, for example, a memory controller. The commands may be provided as internal command signals ICMD to a command decoder 115 via the command/address input circuit 105. The command decoder 115 includes circuits to decode the internal commands ICMD to generate internal commands and signals for performing operations. For example, the command decoder 115 may provide activation commands ACT to the row address control circuit 140 to select a word line and may provide read write commands R/W to the column decoder 145 to select a bit line. The refresh command AREF may be provided by the command decoder 115 to the refresh control circuit 200 when a refresh operation is to be performed. The activation commands ACT may also be provided to the refresh control circuit 200. The refresh command AREF may represent auto refresh commands that result from the semiconductor device 100 receiving a refresh command.

When the internal commands ICMD are indicative of self-refresh entry, the command decoder 115 activates a self-refresh entry command SRE, and when the internal commands ICMD are indicative of self-refresh exit, the command decoder 115 activates a self-refresh exit command SRX. The self-refresh entry command SRE and the self-refresh exit command SRX are supplied to the refresh control circuit 200. When the self-refresh entry command SRE is issued, the semiconductor device 100 enters a self-refresh mode, and performs a self-active refresh operation based on a refresh address generated in the semiconductor device 100. When the self-refresh exit command SRX is issued, the semiconductor device 100 returns to a normal operation mode from the self-refresh mode.

When a read command is received and a memory address is timely supplied with the read command, read data is read from a memory cell MC in the memory array 150 designated by the memory address. The read data is output to outside from the data terminals DQ via read/write amplifiers 155 and the input/output circuit 160. When a write command is received and a memory address is timely supplied with the write command, write data and a data mask (when applicable) are supplied to the data terminals DQ and DM, and the write data is written to a memory cell MC in the memory array 150 designated by the memory address. The write data is received by data receivers in the input/output circuit 160, and supplied via the input output circuit 160 and the read/write amplifiers 155 to the memory array 150.

During the access operations for read and write commands, the row address control circuit 140 may include circuits for determining whether a memory address has been mapped to memory locations in the redundant arrays for example, when a memory address corresponding to a defective memory location in the regular array has been mapped to memory locations of the redundant array (e.g., a redundant row of memory). The memory addresses that have been remapped are stored, and memory addresses associated with access operations are compared with the stored memory addresses. The memory addresses that have been mapped to redundant memory may be stored in nonvolatile storage. An example of a nonvolatile storage are fuse circuits (as well as antifuse circuits) that are programmed with the memory addresses to be stored. When a memory address associated with an access operation matches a stored memory address, memory locations in the redundant array are accessed instead of the memory locations in the regular array.

As previously described, the volatile memory cells are periodically refreshed in order to maintain the data stored by the memory array. The memory cells are typically refreshed as rows of memory cells. The row address control circuit 140 may include a refresh control circuit that is used during refresh operations. Refresh operations are performed when active refresh commands AREF are provided to the row address control circuit 140. Each refresh command AREF results in memory locations associated with a refresh address to be refreshed. In some embodiments of the disclosure, the refresh address may be generated internally in the semiconductor device 100. Similar circuits and operation may be included in the column decoder 145 in some embodiments of the disclosure.

A refresh address may have several memory locations associated with it. For example, multiple rows of memory may be associated with a refresh address, with each of the rows of memory corresponding to a value that when combined with the refresh address identifies the particular row of memory. Such an arrangement may facilitate faster access and refresh operations.

When refreshing the memory; the refresh addresses are determined whether to be mapped to redundant memory locations in the redundant array. In cases where a refresh address has been mapped to redundant memory, the memory locations in the regular array corresponding to the refresh address are not refreshed, thereby avoiding unnecessary refresh operations to memory locations that are not used, for example, when the regular memory locations are defective and the corresponding memory address has been mapped to redundant memory locations. Likewise, redundant memory locations that are not used are also not refreshed, such as when a redundant memory location is defective, or does not have a memory address mapped to it. Skipping refresh operations for memory locations that are not used may reduce power consumption compared to performing refresh operations to all memory locations, regardless of their use.

As shown in FIG. 1, a row hammer refresh circuit 142 is included in the row address control circuit 140. The row hammer refresh circuit 142 analyzes the history of row access to the memory array 150, and a row address that requires a row hammer refresh operation is generated based on the analysis. Specifically, when the frequency of row access to a certain word line exceeds a threshold, a row address of a word line physically adjacent to this word line is generated. With this operation, with respect to a word line physically adjacent to the word line having a frequency of row access exceeding a threshold, an additional refresh operation is performed. The reason why the row hammer refresh operation is necessary to perform for the row address is that, when the frequency of the row address exceeds a threshold, the information retention characteristics of memory cells connected to a word line adjacent to the word line having a frequency of row access exceeding a threshold are lowered.

Turning to an explanation of the external terminals included in the semiconductor device 100, the clock terminals CK and /CK are supplied with complementary external clock signals. The external clock signals may be supplied to a clock input circuit 120. The clock input circuit 120 may generate internal clock signals ICLK. The internal clock signals ICLK are supplied to internal clock generator 130 and to the command decoder 115. When enabled by clock enable CKE from the command/address input circuit 105, the internal clock generator 130 provide various internal clock signals LCLK based on the internal clock signals ICLK. The internal clock signals LCLK may be used for timing the operation of various internal circuits. For example, the LCLK signals may be provided to the input output circuit 160 for timing the operation of the input/output circuit 160 to provide and receive data on the data terminals DQ.

The power supply terminals VDD and VSS are supplied with power supply potentials. These power supply potentials are supplied to an internal voltage generator 170. The internal voltage generator 170 generates various internal potentials VPP, VOD, VARY, VPERI, and the like based on the power supply potentials provided to the power supply terminals VDD and VSS. The internal potential VPP is mainly used in the row address control circuit 140, the internal potentials VOD and VARY are mainly used in the sense amplifiers SAMP included in the memory array 150, and the internal potential VPERI is used in many other peripheral circuit blocks.

The power supply terminals VDDQ and VSSQ are also supplied with power supply potentials. The power supply potentials are supplied to the input-output circuit 160. The power supply potentials provided to the power supply terminals VDDQ and VSSQ may be the same potentials as the power supply potentials provided to the power supply terminals VDD and VSS in some embodiments of the disclosure. Dedicated power supply potentials are provided to the power supply terminals VDDQ and VSSQ so dial power supply noise generated by the input/output circuit 160 does not propagate to the other circuit blocks.

Figure 3:
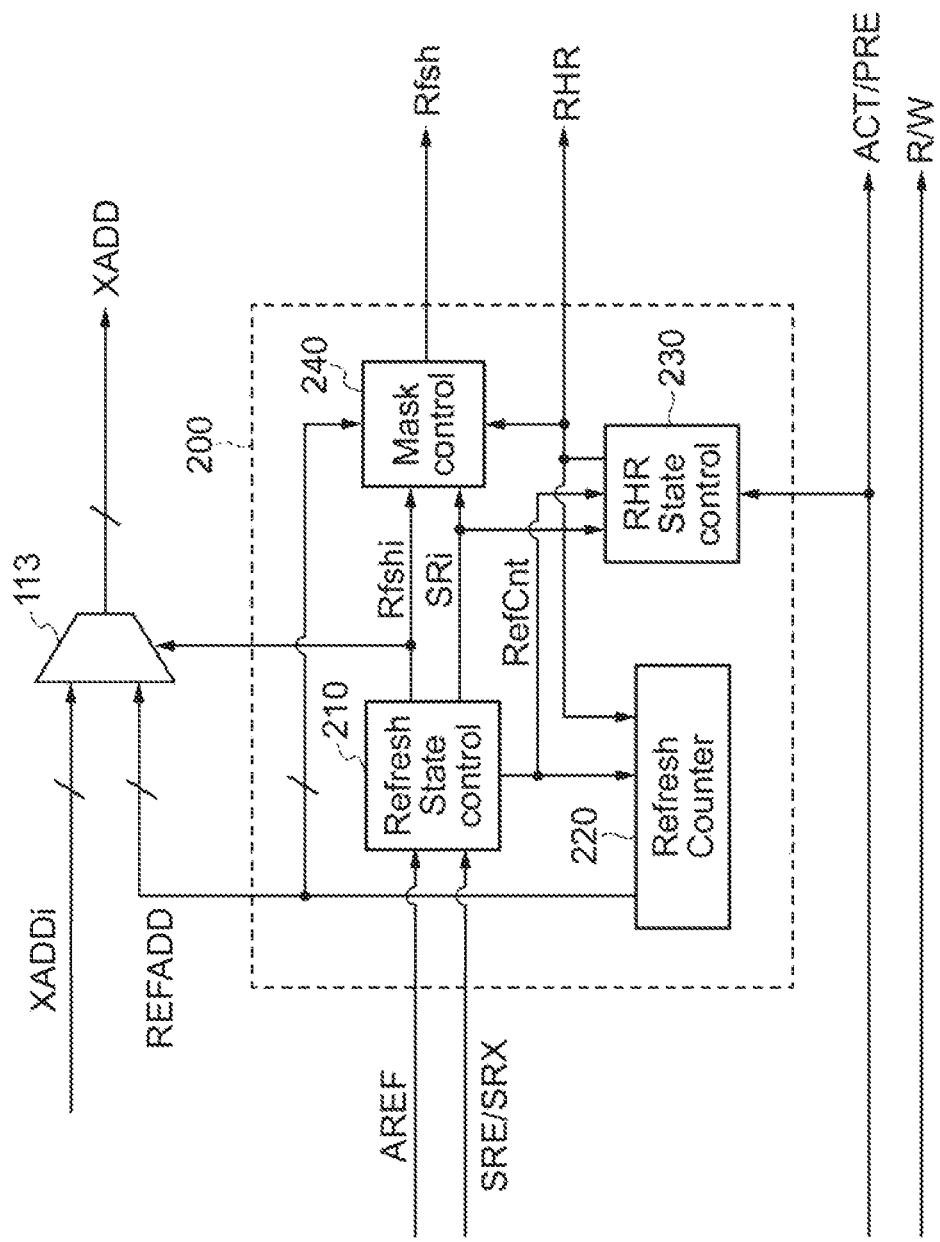
FIG. 3 is a block diagram of a refresh control circuit according to an embodiment of the disclosure.

FIG. 3 is a block diagram showing a configuration of the refresh control circuit 200. As shown in FIG. 3, the refresh control circuit 200 includes a refresh state control circuit 210, a refresh counter 220, an RHR state control circuit 230, and a mask control circuit 240. The refresh state control circuit 210 receives the commands AREF, SRE, and SRX and generates a refresh state signal Rfshi, a self-refresh state signal SRi, and a refresh count signal RefCnt. The refresh state signal Rfshi is a signal that is activated during a period where a refresh operation is performed. The self-refresh state signal SRi is a signal that is activated during a period where the semiconductor device 100 is in a self-refresh mode. The refresh count signal RefCnt is a signal that increments the refresh counter 200. The count value of the refresh counter 220 is supplied to the multiplexer 113 as a refresh address REFADD. The multiplexer 113 receives a row address XADDi and the refresh address REFADD input from outside, selects the row address XADDi input from outside when the refresh slate signal Rfshi is in an inactive state, and selects the refresh address REFADD when the refresh state signal Rfshi is in an active state.

The RHR state control circuit 230 receives the activation command ACT, a precharge command PRE, the refresh count signal RefCnt, and the self-refresh state signal SRi, and generates a row hammer refresh signal RHR. The row hammer refresh signal RHR is activated during a period where a row hammer refresh operation is performed. The mask control circuit 240 receives the refresh address REFADD, the refresh suite signal Rfshi, the self-refresh state signal SRi, and the row hammer refresh signal RHR, and generates a refresh state signal Rfsh. Contrary to the refresh state signal Rfshi, the refresh state signal Rfsh is a signal having undergone row hammer determination and segment mask determination at the time of performing a self-refresh operation.

Figure 4:
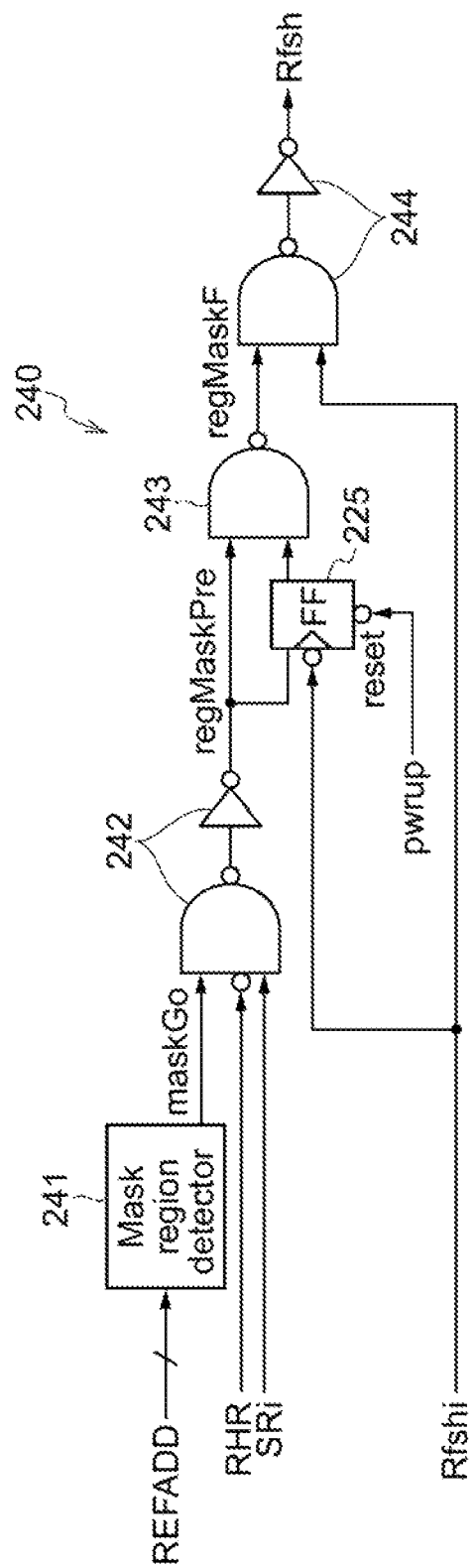
FIG. 4 is a block diagram of a mask control circuit according to an embodiment of the disclosure.

FIG. 4 is a circuit diagram of the mask control circuit 240. As shown in FIG. 4, the mask control circuit 240 includes a mask-region detector 241, AND gate circuits 242 and 244, a NAND gate circuit 243, and a flip-flop circuit 225. The mask-region detector 241 is a circuit that determines whether the current refresh address REFADD belongs to a mask region. When a self-refresh operation is performed, any refresh operation is not performed on the mask region, and thus data retained in the mask region is lost. When it is determined that the current refresh address REFADD belongs to the mask region, the mask-region detector 241 activates a determination signal maskGO at a high level. The determination signal maskGO, the row hammer refresh signal RHR, and the self-refresh state signal SRi are input to the AND gate circuit 242. Accordingly; when the following three conditions are met, which are the semiconductor device 100 is in a self-refresh mode, it is not in a row hammer refresh operation, and the current refresh address REFADD belongs to the mask region, a mask signal regMaskPre is activated at a high level. Meanwhile, when the semiconductor device 100 is in a row hammer refresh operation, the mask signal regMaskPre is not activated.

The mask signal regMaskPre is supplied to one of input nodes of the NAND gate circuit 243 as it is, and is supplied to the other input node of the NAND gate circuit 243 via the flip-flop circuit 225. The flip-flop circuit 225 responds to a power-on signal pwrup and is reset. The refresh state signal Rfshi is supplied to a clock node of the flip-flop circuit 225. Accordingly, after the mask signal regMaskPre is activated at a high level, a mask signal regMaskF output from the NAND gate circuit 243 responds to a start timing of the next refresh operation and is activated at a low level. When the mask signal regMaskF is activated at a low level, the refresh state signal Rfshi is masked by the AND gate circuit 244. On the other hand, when the mask signal regMaskF is at a high level, the refresh state signal Rfshi and the refresh state signal Rfsh have mutually the same waveform. In this manner, the mask control circuit 240 delays the timing of performing a segment mask process using the flip-flop circuit 225 for one cycle. The effects of this process are described later.

Figure 5:
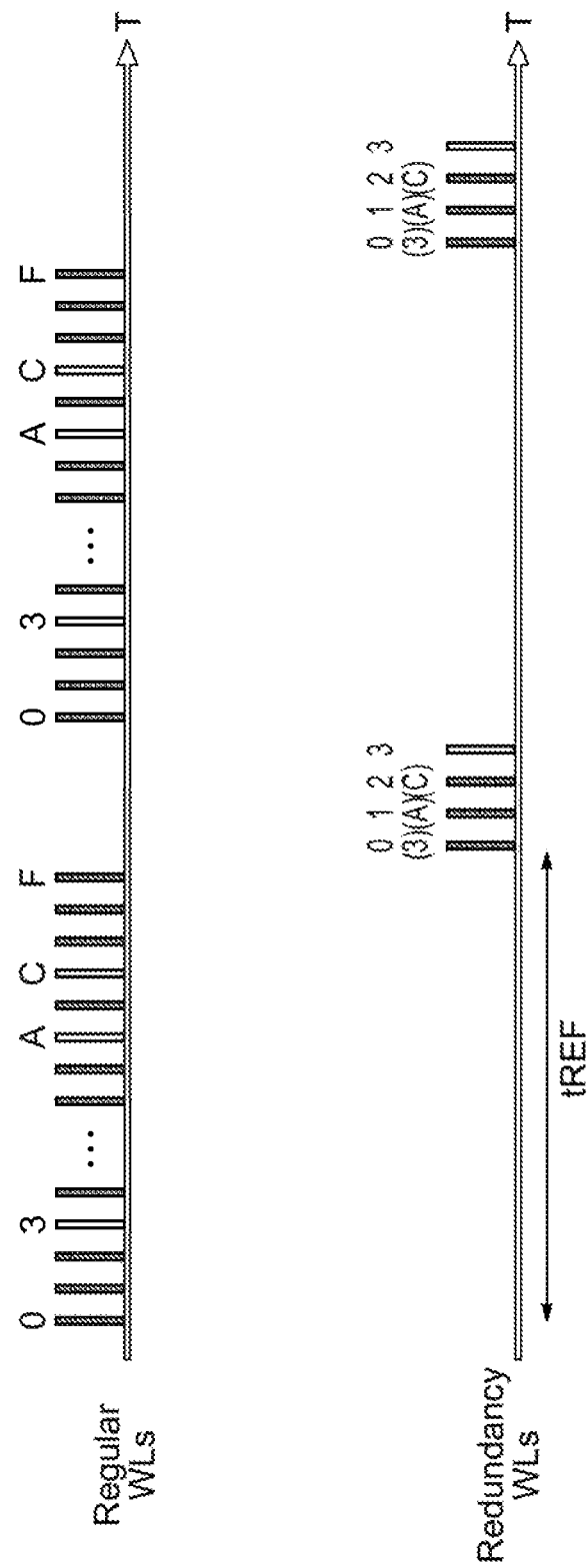
FIG. 5 is a diagram of refresh operations according to an embodiment of the disclosure.

FIG. 5 is a diagram of refresh operations according to an embodiment of the disclosure. The refresh operations of FIG. 5 may be used to refresh memory locations of the memory array 150 of the semiconductor device 100 of FIG. 1 in some embodiments of the disclosure.

FIG. 5 shows refresh operations performed for memory locations of a regular array and for memory locations of a redundant array, in the example of FIG. 5, the memory locations that are refreshed by a refresh operation are associated with a word line. Sixteen word lines (WL0-WLF) are included in the regular array and four word lines are included in the redundant array for the example of FIG. 5. Greater or fewer word lines may be included in the regular and/or redundant arrays without departing from the scope of the disclosure.

Each refresh operation performed in the regular and redundant arrays is represented in FIG. 5 by a dark vertical line. Refresh operations are performed responsive to a refresh command. For example, with reference to the semiconductor device 100 of FIG. 1, the refresh command AREF may be provided by the command decoder 115 to the row address control circuit 140. Refresh operations are performed for memory locations of the regular array over refresh period tREF, and are then followed by refresh operations for memory locations of the redundant array. The refreshing of memory locations for the regular array and then for the redundant array is repeated if necessary.

Skipped refresh operations are represented in FIG. 5 as lighter vertical lines. For example, refresh operations for word lines WL3, WLA, and WLC of the regular array are skipped in the example of FIG. 5. The word lines WL3, WLA, and WLC may be skipped when, for example, the memory addresses corresponding to the word lines WL3, WLA, and WLC have been mapped to memory locations in the redundant array, such as when the memory locations in the regular array corresponding to word lines WL3, WLA, and WLC are defective as explained with reference to FIG. 2. In the example of FIG. 5, WL3, WLA, and WLC are mapped to RWL0, RWL1, and RWL2 of the redundant array, respectively as explained with reference to FIG. 2. Refresh operations for memory locations of the redundant array may also be skipped. For example, refresh operations for word line RWL3 of the redundant array is skipped. The word line WL3 of the redundant array may be skipped when, for example, when the memory locations of word line WL3 of the redundant array are not used (e.g., 00 memory address is mapped to the memory locations of word line WL3 of the redundant array).

Skipping refresh operations for memory locations that are not used, such as when the memory locations are defective and the corresponding memory addresses have been remapped to memory locations of the redundant array, and/or memory locations of the redundant array do not have a memory address mapped thereto, may reduce power consumption by avoiding unnecessary refresh operations to unused memory locations.

Figure 6:
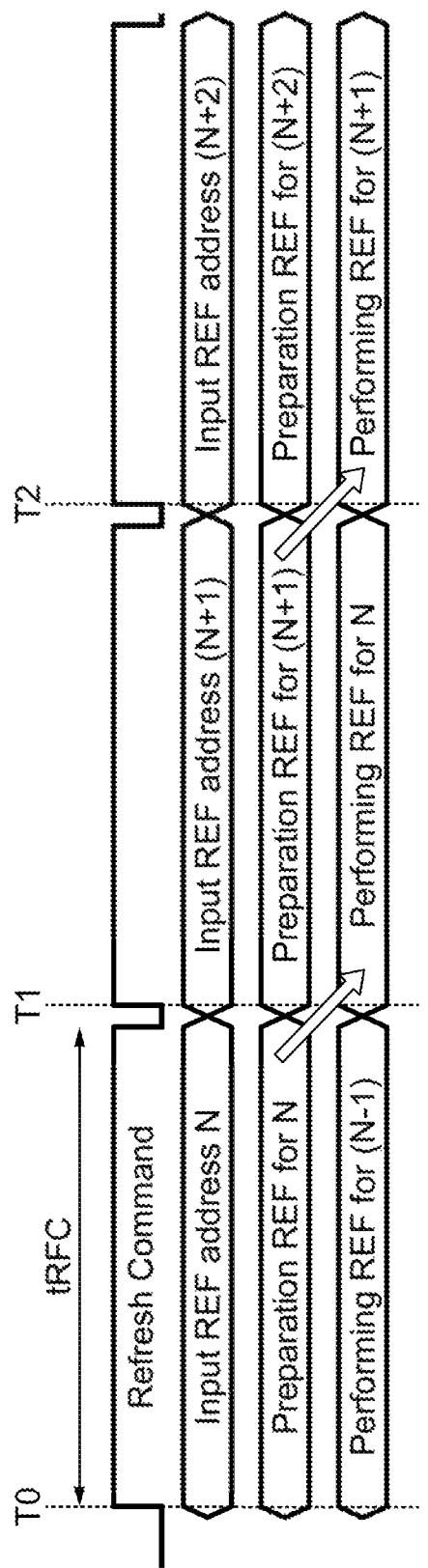
FIG. 6 is a timing diagram of performing refresh operations according to an embodiment of the disclosure.

FIG. 6 is a timing diagram of performing refresh operations according to an embodiment of the disclosure. The refresh operations of FIG. 6 may be used to refresh memory locations of the memory array 150 of the semiconductor device 100 of FIG. 1 in some embodiments of the disclosure.

At time T0, a first active refresh command (e.g., active high logic level) causes a refresh address N to be input and preparations for refresh operations for the refresh address N to be performed. The preparations for the refresh operations may include, for example, determining whether any of the refresh addresses related to the refresh address N match memory addresses stored in a redundancy circuit. The memory addresses stored may be memory addresses that are remapped to redundant memory locations. The refresh addresses related to the refresh address N may be compared to the stored memory addresses to determine whether any of the refresh address have been mapped to the redundant array. Also at time T0, responsive to the first active refresh command, refresh operations are performed for a previous refresh address, that is, refresh address (N−1). The refresh operations for the refresh address (N−1), as well as the input of the refresh address N and preparation for the refresh operations for the refresh address N are performed during refresh time tRFC. Prior to time T1, the first active refresh command becomes inactive by transitioning to a low logic level.

At time T1, a second active refresh command causes a refresh address (N+1) to be input and preparations for refresh operations for the refresh address (N+1) to begin. Also at time T1, responsive to the second active refresh command, a refresh operation is performed for the refresh address N, which was input responsive to the first active refresh command at time T0. The refresh operations for the refresh address N, as well as the input of the refresh address (N+1) and preparations for the refresh operations for the refresh address (N+1) are performed during refresh time tRFC following time T1. Prior to time T2, the second active refresh command becomes inactive by transitioning to a low logic level.

At time T2, a third active refresh command causes a refresh address (N+2) to be input and preparations for refresh operations for the refresh address (N+2) to begin. Also at time T2, responsive to the third active refresh command, a refresh operation is performed for the refresh address (N+1), which was input responsive to the second active refresh command at time T1. The third active refresh command becomes inactive by transitioning to a low logic level.

With reference to the refresh address N, inputting the refresh address and preparing for the refresh operations for the refresh address N responsive to a first active refresh command at time T0 and then performing the refresh operations for the refresh address N responsive to a second active refresh command at time T1 allows the refresh operations for the refresh address N to be completed within the refresh time tRFC. Similarly, inputting the refresh address and preparing for the refresh operations for the refresh address (N+1) responsive to the second active refresh command at time T1 and then performing the refresh operations for the refresh address (N+1) responsive to the third active refresh command at time T2 allows the refresh operations for the refresh address (N+1) to be completed within the refresh time tRFC.

The refresh time tRFC may not be sufficient to input a refresh address, prepare for the refresh operations for the refresh address, and perform the refresh operations associated with the refresh address. The refresh time tRFC may have a maximum time that is set by a timing specification. Exceeding the refresh time tRFC for performing refresh operations for a refresh address may not be acceptable.

Figure 7:
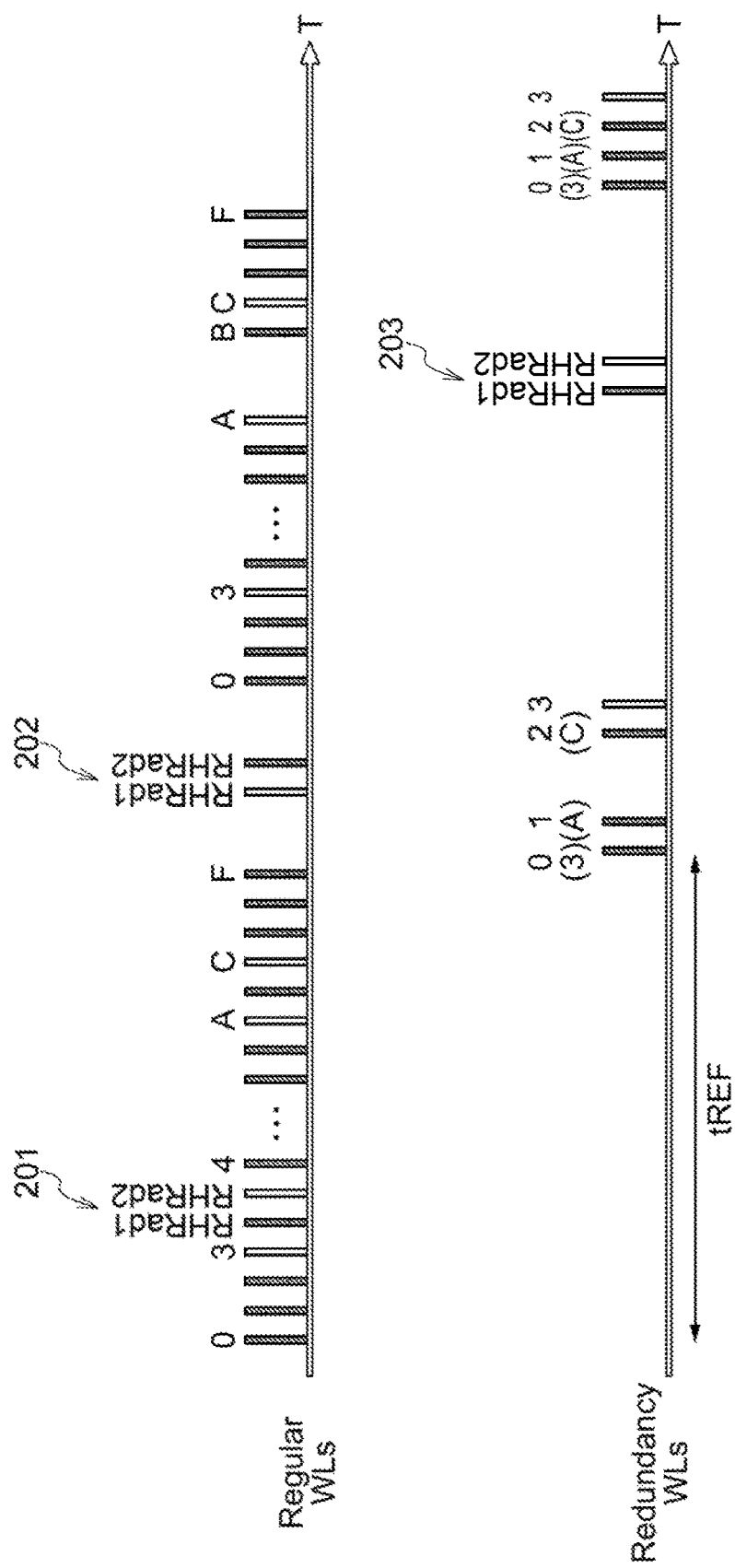
FIG. 7 is a diagram of refresh operations including row hammer refresh operations according to an embodiment of the disclosure.

FIG. 7 is a timing diagram for explaining operations when normal refresh operations are interrupted with row hammer refresh operations. In the example shown in FIG. 7, normal refresh operations are interrupted with three row hammer refresh operations denoted by reference numerals 201 to 203. A refresh operation on the word line WL3 of the regular array 151 (skipped in the example shown in FIG. 7) and a refresh operation on a word line WL4 of the regular array 151 are interrupted with the first row hammer refresh operation 201. As described above, the row hammer refresh operation is an operation to, when the frequency of row access to a certain word line exceeds a threshold, select a word line physically adjacent to this word line and refresh the selected one. Therefore, it is necessary to sequentially select two word lines in one row hammer refresh operation. Reference character RHRad1 denotes the address of a word line selected first in a row hammer refresh operation, and reference character RMRad2 denotes the address of a word line selected second in the row hammer refresh operation. Word lines having a frequency of row address exceeding a threshold are laid out to be sandwiched by a word line corresponding to the address RHRad1 and a word line corresponding to the address RHRad2, and all of them belong to the regular array 151. In the example denoted by reference numeral 201, the word line corresponding to the address RHRad1 does not have any defect and is not replaced with the redundant array 152, and thus a refresh operation thereon is performed. On the other hand, the word line corresponding to the address RHRad2 is detective and is replaced with the redundant array 152, and thus a refresh operation is skipped. Accordingly; unnecessary power consumption is reduced. In this manner, in the row hammer refresh operation, when a word line as a refresh target is replaced with the redundant array 152, a refresh operation on the word line of the replacing origin belonging to the regular array 151 is skipped.

A refresh operation on the word line RWL1 of the redundant array 152 and a refresh operation on the word line RWL2 of the redundant array 152 are interrupted with the second row hammer refresh operation 202. A word line having a frequency of row address exceeding a threshold, a word line corresponding to the address RHRad1, and a word line corresponding to the address RHRad2 all belong to the regular array 151. In this manner, during a period where a normal refresh operation is performed on the redundant array 152, there is a case where normal refresh operations are interrupted with a row hammer refresh operation with respect to the regular array 151. In the example denoted by reference sign 202, the word line corresponding to the address RHRad2 has no defect and is not replaced with the redundant array 152, and thus a refresh operation is performed thereon. On the other hand, the word line corresponding to the address RHRad1 is defective and has been replaced with the redundant array 152, and thus a refresh operation thereon is skipped.

A refresh operation on the word line WLA of the regular array 151 and a refresh operation on a word line WLB of the regular array 151 are interrupted with the third row hammer refresh operation 203. A word line having a frequency of row address exceeding a threshold, a word line corresponding to the address RHRad1 and a word line corresponding to the address RHRad2 all belong to the redundant array 152. In this manner, during a period where a normal refresh operation is performed on the regular array 151, there is a case where normal refresh operations are interrupted with a row hammer refresh operation with respect to the redundant array 152. In the example denoted by reference numeral 203, the word line corresponding to the address RHRad1 is used and an effective logical address is assigned thereto, and thus a refresh operation is performed thereon. On the other hand, the word line corresponding to the address RHRad2 is unused and any effective logical address is not assigned thereto, and thus a refresh operation thereon is skipped. In this manner, in the row hammer refresh operation, when a word line as a refresh target is unused in the regular array 151, a refresh operation thereon is skipped.

Figure 8:
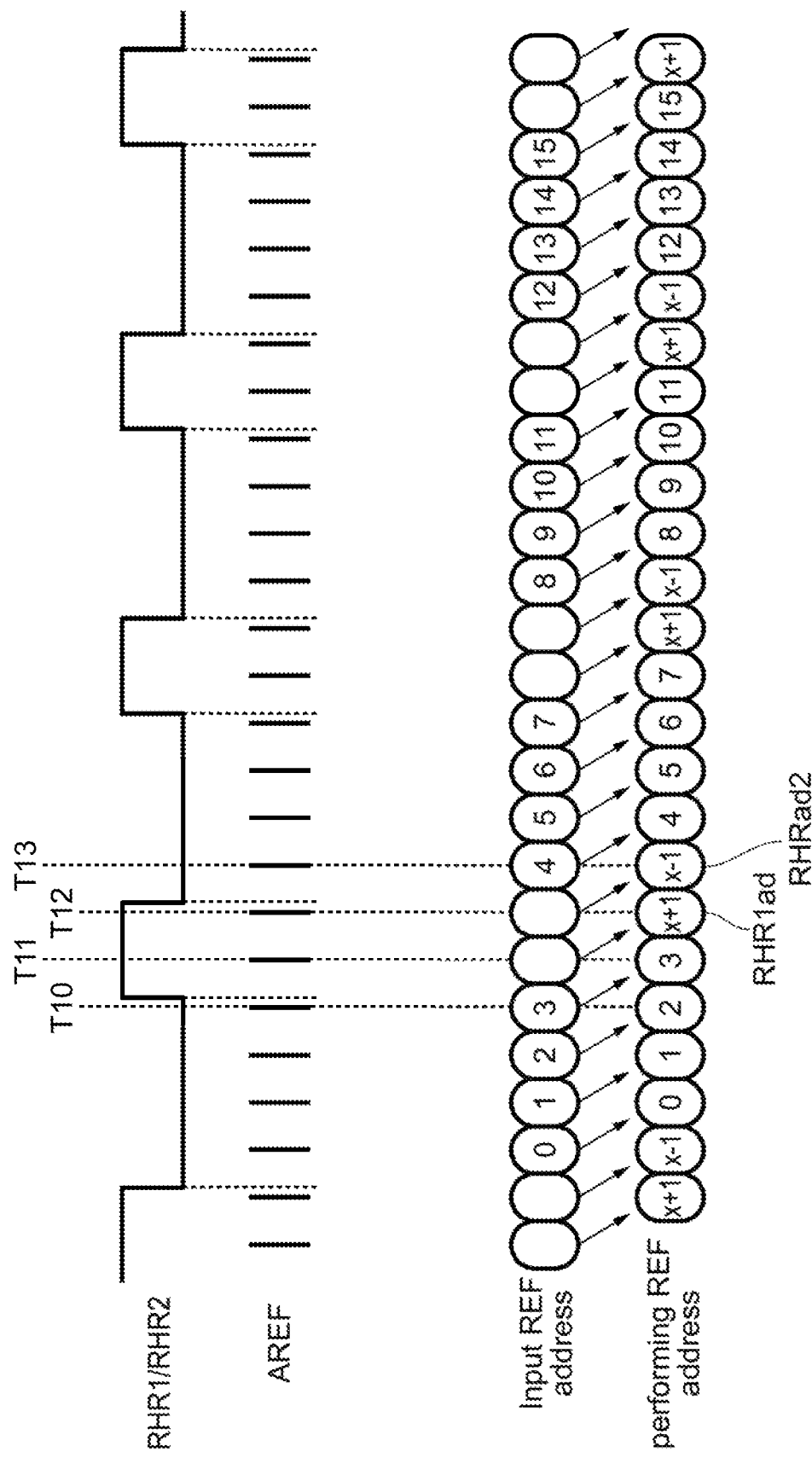
FIG. 8 is a timing diagram of performing refresh operations including row hammer refresh operations according to an embodiment of the disclosure.

FIG. 8 is a timing diagram for explaining a relation between input timing of a refresh address and execution timing of a refresh operation. As shown in FIG. 8, during a period where any row hammer refresh operation is not performed, that is, during a period where both row hammer refresh signals RHR1 and RHR2 are inactivated a refresh address is updated each time the refresh command AREF is issued, a word line corresponding to a refresh address input by responding to the previous refresh command AREF is selected, and information of a plurality of memory cells connected to this word line is refreshed. On the other hand, during a period where a row hammer refresh operation is performed, that is, during a period where the row hammer refresh signals RHR1 and RHR2 are activated, updating of a refresh address having responded to the refresh command AREF is stopped, and word lines requiring row hammer refresh are selected. As described above, two word lines are selected in one row hammer refresh operation. In this example, when it is assumed that the address of a word line having a frequency of row access exceeding a threshold is x, the addresses of word lines selected in one row hammer refresh operation are addresses x+1 and x−1. The address x+1 corresponds to the address RHRad1 shown in FIG. 7, for example, and the address x−1 corresponds to the address RHRad2 shown in FIG. 7, for example.

For example, the refresh command AREF is issued at each of times T10, T11, T12, and T13 shown in FIG. 8, and the row hammer refresh signals RHR1 and RHR2 are activated at times T11 and T12. In this case, a refresh address <3> is input at time T10, and a refresh operation is actually performed on a refresh address <2> input by responding to the previously issued refresh command AREF. Next, when the refresh command AREF is issued at time T11, a refresh operation is actually performed on the refresh address <3>. However, at this time point, because the row hammer refresh signals RHR1 and RHR2 are activated, updating of the refresh address is not performed and the refresh address <3> is maintained. Further, at time T11, a refresh address <x+1> corresponding to the row hammer refresh signal RHR1 is prepared. Next, when the refresh command AREF is issued at time T12, a refresh operation is actually performed on the refresh address <x+1>. At this time point, because the row hammer refresh signals RHR1 and RHR2 are activated, updating of the refresh addresses is not performed and the refresh address <3> is maintained. Further, at time T12, a refresh address <x−1> corresponding to the row hammer refresh signal RHR1 is prepared. Next, when the refresh command AREF is issued at time T13, a refresh operation is actually performed on the refresh address <x−1>. At this time point, because both the row hammer refresh signals RHR1 and RHR2 are inactivated, the refresh address is updated as a refresh address <4>.

Figure 9:
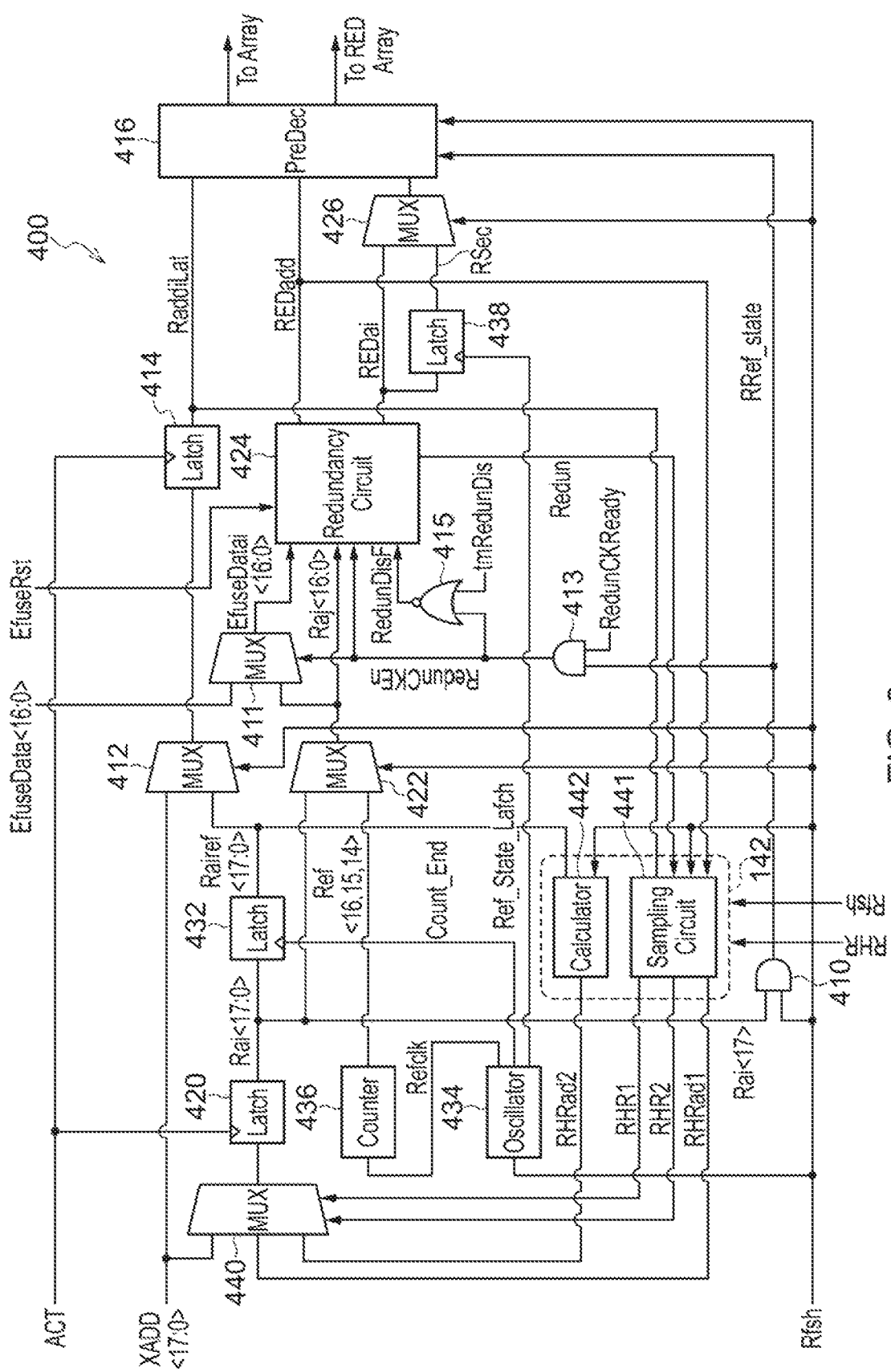
FIG. 9 is a block diagram of a refresh control circuit according to an embodiment of the disclosure.

FIG. 9 is a refresh control circuit 400 according to an embodiment of the disclosure. The refresh control circuit 400 may be included in the row address control circuit 140 of the semiconductor device 100 in some embodiments of the disclosure.

The refresh control circuit 400 receives an activation command ACT, a refresh state signal Rfsh, and decoded row addresses XADD. The ACT command, the AREF command may be provided by a command decoder (e.g., command decoder 115 of semiconductor device 100). The refresh state signal Rfsh may be provided by the refresh counter circuit 200.

The XADD address is provided to a selector circuit 440. The selector circuit 440 selects one of the XADD address, a first row hammer refresh address RHRad1, and a second row hammer refresh address RHRad2 based on row hammer refresh signals RHR1 and RHR2. The selector circuit 440 selects and outputs the XADD address to a latch circuit 420 when row hammer refresh signals RHR1 and RHR2 are in an inactive state. The selector circuit 440 selects and outputs the first row hammer refresh address RHRad1 to the latch circuit 420 when the row hammer refresh signal RHR1 is in an active state. The selector circuit 440 selects and outputs the second row hammer refresh address RHRad2 to the latch circuit 420 when the row hammer refresh signal RHR2 is in an active state. The latch circuit 420 latches the XADD address, the first row hammer refresh address RHRad1, or the second row hammer refresh address RHRad2 responsive to the ACT command. The address latched in the latch circuit 420 is provided as a Rai address to a latch circuit 432 and to a selector circuit 422. The latch circuit 432 latches the Rai address responsive to a Count_End pulse provided by an oscillator circuit 434. The latched Rai address is provided to the selector circuit 412 as internal address Rairef. The selector circuit 412 selects providing the XADD or Rairef address to the address latch 414. The address latch 414 latches the address from the selector circuit 412 responsive to the ACT command. The latched address is provided to an address predecoder circuit 416. The address latches 420, 432, and 414 are a series of latch circuits through which addresses propagate to the address predecoder circuit 416, and as will be described in more detail below; provide the timing for preparing for refresh operations for a refresh address when an active AREF command is received and then performing (or skipping) refresh operations to the refresh address when a subsequent active AREF command is received. The address predecoder circuit 416 controls whether a refresh operation is performed or skipped for a refresh address provided by the latch circuit 414 based on redundancy information provided by a redundancy circuit 424.

An expanded 1-bit is added to the XADD address. In the present embodiment, in an XADD<17:0> address, a most significant bit XADD<17> is the added bit. The XADD<17> address indicates whether the corresponding address is assigned to the regular array 151 or to the redundant array 152. When the XADD<17> address is at a low level, it indicates that the corresponding address is assigned to the regular array 151, and when the XADD<17> address is at a high level, it indicates that the corresponding address is assigned to the redundant array 152. This feature is also the same for the address Rai and the address Rairef. A most significant bit Rai<17> of the address Rai is input to the AND gate circuit 410. Accordingly, at the time of accessing the redundant array 152, an RRef_State signal is activated while coordinating with the refresh state signal Rfsh.

The oscillator circuit 434 is activated by the refresh state signal Rfsh. When activated, the oscillator circuit 434 provides an oscillating output signal Ref_State_Latch, the Count_End pulse, and an oscillating output signal Refclk. An active Count_End pulse is provided by the oscillator circuit 434 every six oscillations of the Ref_State_Latch signal. The Refclk signal is provided to a counter circuit 436, which provides a count Ref<16,15,14>. The Ref<16,15,14> count may be a 3-bit count in some embodiments of the disclosure. However, in other embodiments of the disclosure, the count may include greater or fewer bits. Thus, the scope of the disclosure is not limited by the particular number of bits for the count provided by the counter circuit 436. The Ref<16,15,14> count changes responsive to the oscillating Refclk signal. For example, the Ref<16,15,14> count may increment responsive to the oscillating Refclk signal. In other embodiments of the disclosure, the Ref<16, 15,14> count decrement. In some embodiments of the disclosure, the Ref<16, 15,14> count increments from 000 to 101 (i.e., increments from 0 to 5) before returning to 000 to start incrementing again. Thus, in such embodiments of the disclosure, six different values are provided as the Ref<16, 15,14> count. The Ref<16,15,14> count is provided to the selector circuit 422.

The selector circuit 422 provides the Raj<16:0>address to the redundancy circuit 424 for ACT commands, and for AREF commands, combines the Ref<16, 15, 14> count with the Rai address and provides the combined address to the redundancy circuit 424. The redundancy circuit 424 compares the address from the selector circuit 422 with stored memory addresses to determine if the Raj<16:0>address from the selector circuit 422 matches one of the stored memory addresses. As previously described, the stored memory addresses may be memory addresses that are remapped to redundant memory locations. Memory addresses that have been mapped to redundant memory; for example, for repairing defective memory locations, are stored and compared to incoming memory addresses to determine whether to access original memory locations or redundant memory. In some embodiments of the disclosure the stored memory addresses are stored by the redundancy circuit 424, whereas in other embodiments of the disclosure the stored memory addresses are stored by a storage circuit that is accessible by the redundancy circuit 424. The redundancy circuit 424 provides redundancy information REDai indicative of whether a match is determined between a current refresh address represented by the Raj address matches a store memory address. The memory addresses may be stored in nonvolatile storage circuits. For example, in some embodiments of the disclosure, the memory addresses are programmed in fuse circuits (and/or antifuse circuits). The fuse circuits may be included in the redundancy circuit 424 in some embodiments of the disclosure.

The Raj<16:0> address is also supplied to a selector 411. The selector 411 receives the Raj<16:0> address and fuse data EfuseData<16:0>, responds to an enable signal RedunCkEn to set one of them as fuse data EfuseDatai<16:0>, and supplies the fuse data EfuseDatai<16:0> to the redundancy circuit 424. The enable signal RedunCkEn is generated by an AND gate circuit 413 that receives the RRef_State signal and a ready signal RedunCkReady. A NOR gale circuit 415 receives the enable signal RedunCkEn and a test mode signal tmRedunDis and a disable signal RedunDisF as the output from the NOR gate circuit 415 to the redundancy circuit 424. The test mode signal tmRedunDis invalidates normal redundancy determination (whether it is replaced), and is used for checking the address of the replacing origin, for example.

Figure 10:
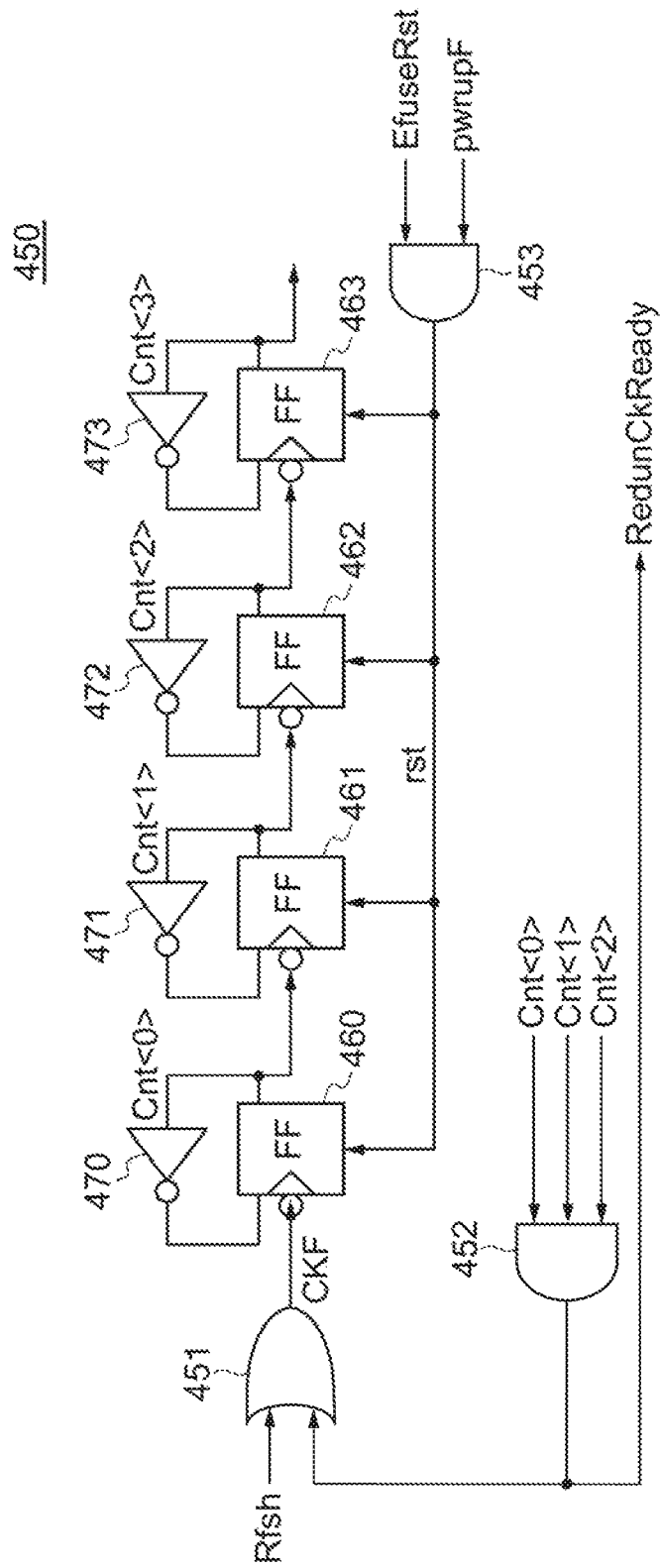
FIG. 10 is a circuit diagram of a ready signal generation circuit according to an embodiment of the disclosure.

FIG. 10 is a circuit diagram of a ready signal generation circuit 450 that generates the ready signal RedunCkReady. As shown in FIG. 10, the ready signal generation circuit 450 includes cascaded flip-flop circuits 460 to 463. The input nodes and output nodes of the flip-flop circuits 460 to 463 are respectively connected to one another via inverters 470 to 473. With this configuration, the flip-flop circuits 460 to 463 constitute a counter and counter values Cnt<0> to Cnt<2> of the counter are supplied to an AND gate circuit 452. The output from the AND gate circuit 452 is the ready signal RedunCkReady. A clock signal CKF is supplied from an OR gate circuit 451 to the flip-flop circuit 460 on the from stage. Because the refresh state signal Rfsh and the ready signal RedunCkReady are supplied to the OR gate circuit 451, when the ready signal RedunCkReady is at a low level, the counter values Cnt<0> to Cnt<2> of the counter constituted by the flip-flop circuits 460 to 463 are incremented each time the refresh state signal Rfsh is supplied. The flip-flop circuits 460 to 463 are reset by a reset signal rst. The reset signal rst is generated by an AND gate circuit 453 that receives a reset signal EfuseRst and a power-on signal pwrupF. The reset signal EfuseRst is a reset signal used for a fuse load operation at its initial stage. The power-on signal pwrupF is a signal that is generated and supplied by an internal power supply circuit at the time of turning the power on, and has a possibility that it is not generated according to the status of power being turned on or off. Therefore, in order to increase the accuracy of resetting the flip-flop circuits 460 to 463, both the reset signal EfuseRst and the power-on signal pwrupF are used.

First, in an initializing operation after turning the power on, when the flip-flop circuits 460 to 463 are reset, all the counter values Cnt<0> to <2> are initialized at a low level. Thereafter, these counter values are incremented each time the refresh state signal Rfsh is supplied, and when the refresh slate signal Rfsh is activated eight times, all the counter values Cnt<0> to Cnt<2> are shifted to a high level, and the ready signal RedunCkReady is activated at a high level. The ready signal RedunCkReady is used as a signal that indicates completion of a fuse load operation to the redundancy circuit 424 after turning the power on.

The redundancy information REDai is provided to a selector circuit 426 and is also provided to latch circuit 438. The latch circuit 438 latches the redundancy information REDai responsive to the Ref_State_Latch signal from the oscillator circuit 434 to be provided as a redundancy flag RSec. The state of the RSec flag is indicative of whether the redundancy information REDai indicates a match between a current refresh address and a stored memory address or not. The RSec flag is provided to the selector circuit 426, which provides either the REDai signal or RSec flag to the address predecoder circuit 416 based on the AREF command (represented by the Ref_State signal). A control signal RRef_State is also provided to the address predecoder circuit 416, which is provided by the AND gate circuit 410. The RRef_State signal indicates whether the refresh addresses provided by the refresh address counter circuit 220 are for memory locations of the regular array or the redundant array.

The address predecoder circuit 416 provides activation signals to perform or skip refresh operations to refresh memory locations in the regular array and the redundant array based on the redundancy information from the selector circuit 426 and the RRef_State and Ref_State signals.

During an access operation, an activation command ACT is provided to the refresh control circuit 400. When the activation command ACT is active (and the refresh command AREF is inactive), the decoded row address XADD<17:0> is provided through the selector circuit 412 to latch circuit 414. The decoded row address XADD<17:0> may be provided by an address decoder (e.g., address decoder 112 of semiconductor device 100). The latch circuit 414 latches the address XADD<17:0> responsive to the active ACT command. The latched XADD<17:0> address is provided as internal address RaddiLat to an address predecoder circuit 416. The XADD<17:0> address is also provided to latch circuit 420 which latches the XADD<17:0> address responsive to the active ACT command through selector circuit 440. The latched XADD<17:0> address is provided by the latch circuit 420 as internal address Rai through selector circuit 422 to redundancy circuit 424. The XADD<17:0> address is provided to the redundancy circuit 424 (as the Rai address) to determine whether the XADD<17:0> address matches a stored memory address. As previously described, memory addresses that have been mapped to redundant memory; for example, for repairing defective memory locations, are stored and compared to incoming memory addresses to determine whether to access original memory locations or redundant memory.

If the redundancy circuit 424 determines that the Raj address does not match a stored memory address, redundancy information REDai that indicates a match was not determined is provided through the selector circuit 426 to the address predecoder circuit 416. The RaddiLat address provided by the address predecoder circuit 416 is accessed based on the redundancy information from the redundancy circuit 424 indicating that a match was not detected. However, if the Raj address matches a stored memory address stored by the redundancy circuit 424, redundancy information REDai that indicates a match is determined is provided through the selector circuit 426 to the address predecoder circuit 416. The redundancy circuit 424 also provides a redundant, address REDadd that indicates a destination address in the redundant memory location. The redundant address REDadd for the redundant memory location to which the Raj address is mapped is provided for access based on the redundancy information from the redundancy circuit 424 indicating that a match was determined.

Figure 11:
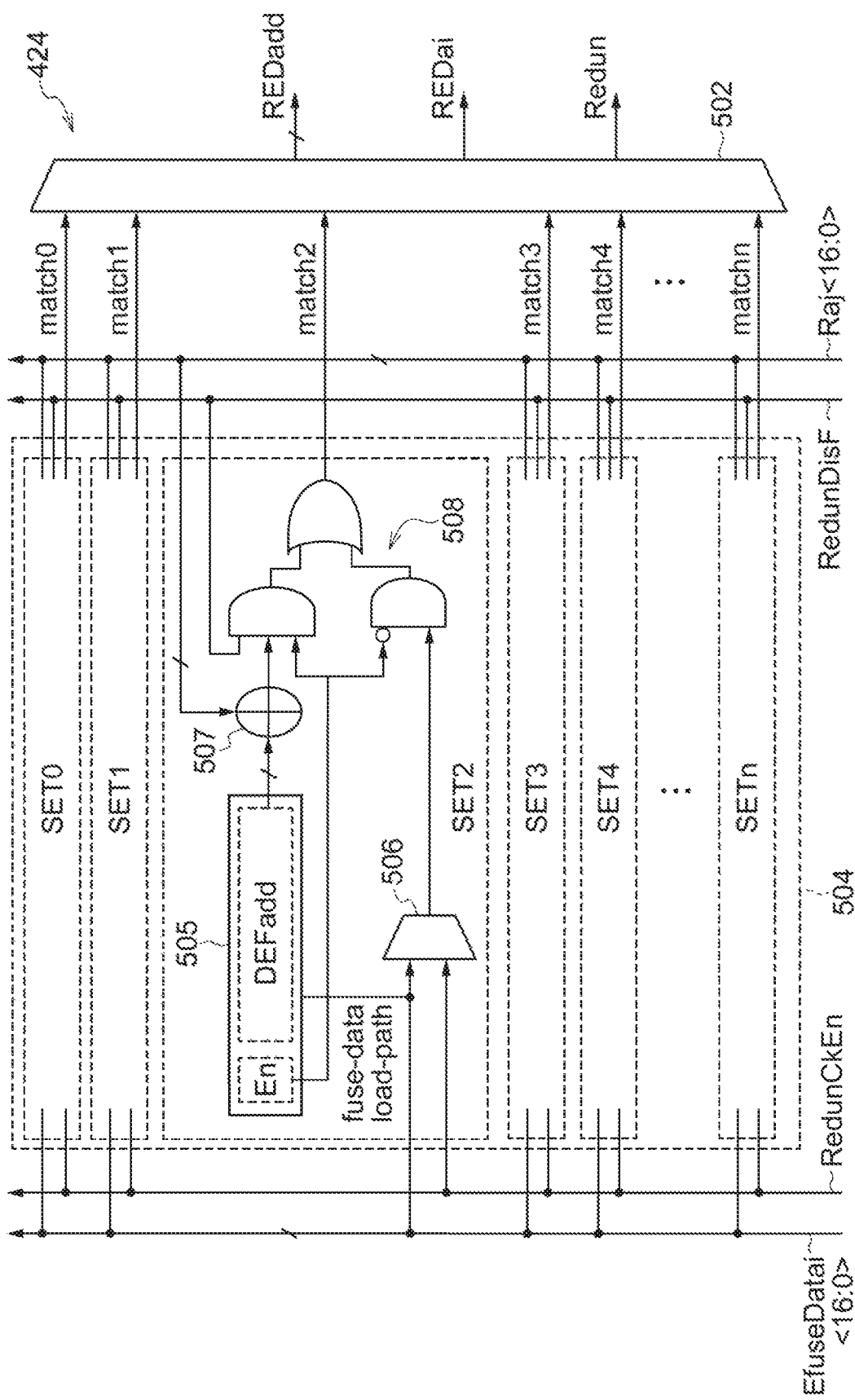
FIG. 11 is a block diagram of a redundancy circuit according to an embodiment of the disclosure.

As shown in FIG. 11, the redundancy circuit 424 includes an address retention circuit 504 including a plurality of memory sets SET0 to SETn. The memory sets SET0 to SETn respectively include a memory unit 505 constituted by an address DEFadd of a detective word line in the regular array 151 and an enable bit En, a decoder circuit 506, an EXNOR circuit 507, and a composite gate circuit 508. The address DEFadd indicates a word line in the regular array 151 as the replacing origin, and a set address assigned to the corresponding memory set indicates a word line in the redundancy array as the replacing target. The enable bit En is information indicating whether the corresponding memory set is used. Therefore, when the enable bit En is in an inactive state, the word line in the redundant array 152 corresponding to the memory set is unused. The address DEFadd of the defective word line is retained in a fuse array 143 shown in FIG. 1, and the address DEFadd is loaded into the address retention circuit 504 in an initializing operation alter turning the power on. A part of a path for loading the address DEFadd into the address retention circuit 504 from a fuse circuit is a path for connecting the selector 411 and the redundancy circuit 424 to each other.

When normal row access is performed, the Raj address and the defective address DEFadd retained in a memory set among the memory sets SET0 to SETn having its enable bit En activated are compared by the EXNOR circuit 507. As a result, when the Raj address matches the defective address DEFadd, the output from the EXNOR circuit 507 becomes a high level. As a result, corresponding match signals match0 to matchn are activated as far as the disable signal RedunDisF is not activated at a low level. The match signals match0 to matchn are supplied to the encoder circuit 502. When any of the match signals match0 to matchn is activated, the encoder circuit 502 activates the redundancy information REDai, and outputs a set address REDadd of a memory set having a matched defective address DEFadd. At this time, a signal Redun is also activated at a high level. The set address REDadd is supplied to the address predecoder circuit 416. With this configuration, the word line in the redundant array 152 indicated by the set address REDadd is selected instead of the word line in the regular array 151 indicated by the Raj address. On the other hand, when the Raj address does not match any defective address DEFadd retained in effective memory sets, the redundancy information REDai and the signal Redun are in an inactive state. Accordingly, any substitute access to the redundant array 152 is not performed and the word line in the regular array 151 indicated by the Raj address is selected.

At the time of a refresh operation, the operation of the redundancy circuit 424 is different according to whether the RRef_State signal is indicating a refresh operation on the redundant array 152. That is, the operation of the redundancy circuit 424 is different according to whether the target of the refresh operation is the regular array 151 or the redundant array 152. First, when the RRef_State signal is inactivated, that is, when the target of the refresh operation is the regular array 151, the Raj address and the defective address DEFadd retained in a memory set among the memory sets SET0 to SETn having its enable bit En activated are compared by the EXNOR circuit 507. As a result, when the Raj address does not match any defective address DEFadd retained in effective memory sets, the redundancy information REDai is in an inactive state. In this case, the word line in the regular array 151 indicated by the Raj address is selected, and information of a memory cell corresponding to the word line is refreshed. On the other hand, when the Raj address matches any of defective addresses DEFadd retained in effective memory sets, the redundancy information REDai is activated. Accordingly, the refresh operation on the Raj address is skipped.

Meanwhile, when the RRef_State signal is activated, that is, when the target of the refresh operation is the redundant array 152, the enable signal RedunCkEn becomes a high level, and the disable signal RedunDisF is shifted to a low level. Accordingly, the comparison result of the EXNOR circuit 507 is invalidated, and the decoder circuit 506 becomes effective. Thereafter, the enable bit En of a memory set selected based on the (use data EfuseDatai<16:0> is read and supplied to the encoder circuit 502 via the composite gate circuit 508. As a result, when the enable bit En of the corresponding memory set is activated, that is, when the word line in the redundancy array 152 corresponding to the memory set is used, the redundancy information REDai is set to be an inactive state. In this case, the word line in the redundant array 152 indicated by the Raj address is selected, and information of the memory cell corresponding to the word line is refreshed. On the other hand, when the enable bit En of the corresponding memory set is inactivated that is, when the word line in the redundant array 152 corresponding to the memory set is unused, the redundancy information REDai is activated. Accordingly, the refresh operation on the Raj address is skipped.

In the present embodiment, both redundancy determination of a normal regional address (whether it is replaced) and redundancy determination of a redundant regional address (whether it is used) are performed by the redundancy circuit 424. Accordingly, if a path to the redundancy circuit 424 is designed in a simple manner, the load of the decoder circuit 506 is added on the path, and it becomes necessary to drive a path with a large load each time an active command is issued. In this case, it is needless to mention that both speed and power of the semiconductor device 100 are degraded. Therefore, in the present embodiment, a path used for redundancy determination of a normal regional address (whether it is replaced) and a path for redundancy determination of a redundant regional address (whether it is used) are separated from each other. Further, it is not necessary to newly add the path for redundancy determination of a redundant regional address (whether it is used), and a path 144 provided for loading fuse data from the fuse array 143 shown in FIG. 1 is reused. The path for loading fuse data is a path for connecting the selector 411 and the redundancy circuit 424 shown in FIG. 9 to each other. With this configuration, it is possible to reduce the load on a path for redundancy determination of a normal regional address without newly adding a path for redundancy determination of a redundant regional address (whether it is used).

The operation of the redundancy circuit 424 at the time of a refresh operation is the same as a normal refresh operation and a row hammer refresh operation. Therefore, when a word line in the regular array 151 as the target of the row hammer refresh operation is defective and is replaced with a word line in the redundant array 152, a refresh operation thereon is skipped. Further, also when the word line in the redundant array 152 as the target of the row hammer refresh operation is unused, a refresh operation thereon is skipped. Accordingly, power consumption due to unnecessary refresh operations is reduced.

Referring back to FIG. 9, the refresh control circuit 400 includes the row hammer refresh circuit 142. The row hammer refresh circuit 142 includes a sampling circuit 441 and a calculator 442. The sampling circuit 441 analyzes the history of row access to memory arrays by sampling the internal address RaddiLat and the redundant address REDadd output from the latch circuit 414. The signal Redun indicating whether the XADD address has been replaced is also input to the sampling circuit 441. That is, the addresses analyzed by the sampling circuit 441 are addresses having undergone redundancy determination, and whether an address RaddiLat before redundancy determination is sampled or a redundant address REDadd having been converted to an address of a redundancy region is sampled is determined based on the signal Redun. When the XADD address responded to an active command is replaced, the redundant address REDadd having been converted to an address of the redundancy region is sampled. Accordingly, even in a border region between a normal region and a redundancy region, calculation of adjacent addresses can be performed correctly.

When the frequency of row access to a certain word line exceeds a threshold, the sampling circuit 441 sequentially activates the row hammer refresh signals RHR1 and RHR2. The row hammer refresh signal RHR1 is activated at timing of selecting a word line adjacent to one side of the word line having the frequency of row access exceeding a threshold. The row hammer refresh signal RHR2 is activated at timing of selecting a word line adjacent to the other side of the word line having the frequency of row access exceeding a threshold. The sampling circuit 441 generates the first row hammer refresh address RHRad1 at timing when the row hammer refresh signal RHR1 is activated. The first row hammer refresh address RHRad1 has a value obtained by reversing a least significant bit of the address of the word line having the frequency of row address exceeding a threshold. The calculator 442 generates the second row hammer refresh address RHRad2 at timing when the row hammer refresh signal RHR2 is activated. The value of the second row hammer refresh address RHRad2 is calculated by the calculator 442.

The row hammer refresh signals RHR1 and RHR2 are supplied to the selector circuit 440. When the row hammer refresh signal RHR1 is activated, the selector circuit 440 selects the first row hammer refresh address RHRad1, and when the row hammer refresh signal RHR2 is activated, the selector circuit 440 selects the second row hammer refresh address RHRad2.

First, when the sampling circuit 441 detects a fact that the frequency of row access to a certain word line has exceeded a threshold, the sampling circuit 441 responds to the refresh command AREF to activate the row hammer refresh signal RHR1, and generates the first row hammer refresh address RHRad1. The first row hammer refresh address RHRad1 is latched in the latch circuit 420 via the selector circuit 440. The first row hammer refresh address RHRad1 latched in the latch circuit 420 is supplied to the redundancy circuit 424 via the selector circuit 422. By performing the operations described above, the redundancy circuit 424 performs or skips a refresh operation corresponding to the first row hammer refresh address RHRad1. The first row hammer refresh address RHRad1 is fed back to the calculator 442 via the latch circuit 432, and the second row hammer refresh address RHRad2 is calculated by the calculator 442.

When the refresh command AREF is activated again, the sampling circuit 441 inactivates the row hammer refresh signal RHR1 and activates the row hammer refresh signal RHR2. The second row hammer refresh address RHRad2 calculated by the calculator 442 is latched in the latch circuit 420 via the selector circuit 440. The second row hammer refresh address RHRad2 latched in the latch circuit 420 is supplied to the redundancy circuit 424 via the selector circuit 422. By performing the operations described above, the redundancy circuit 424 performs or skips a refresh operation corresponding to the second row hammer refresh address RHRad2. Thereafter, the row hammer refresh signal RHR2 is inactivated and a series of row hammer refresh operations is completed.

Figure 12:
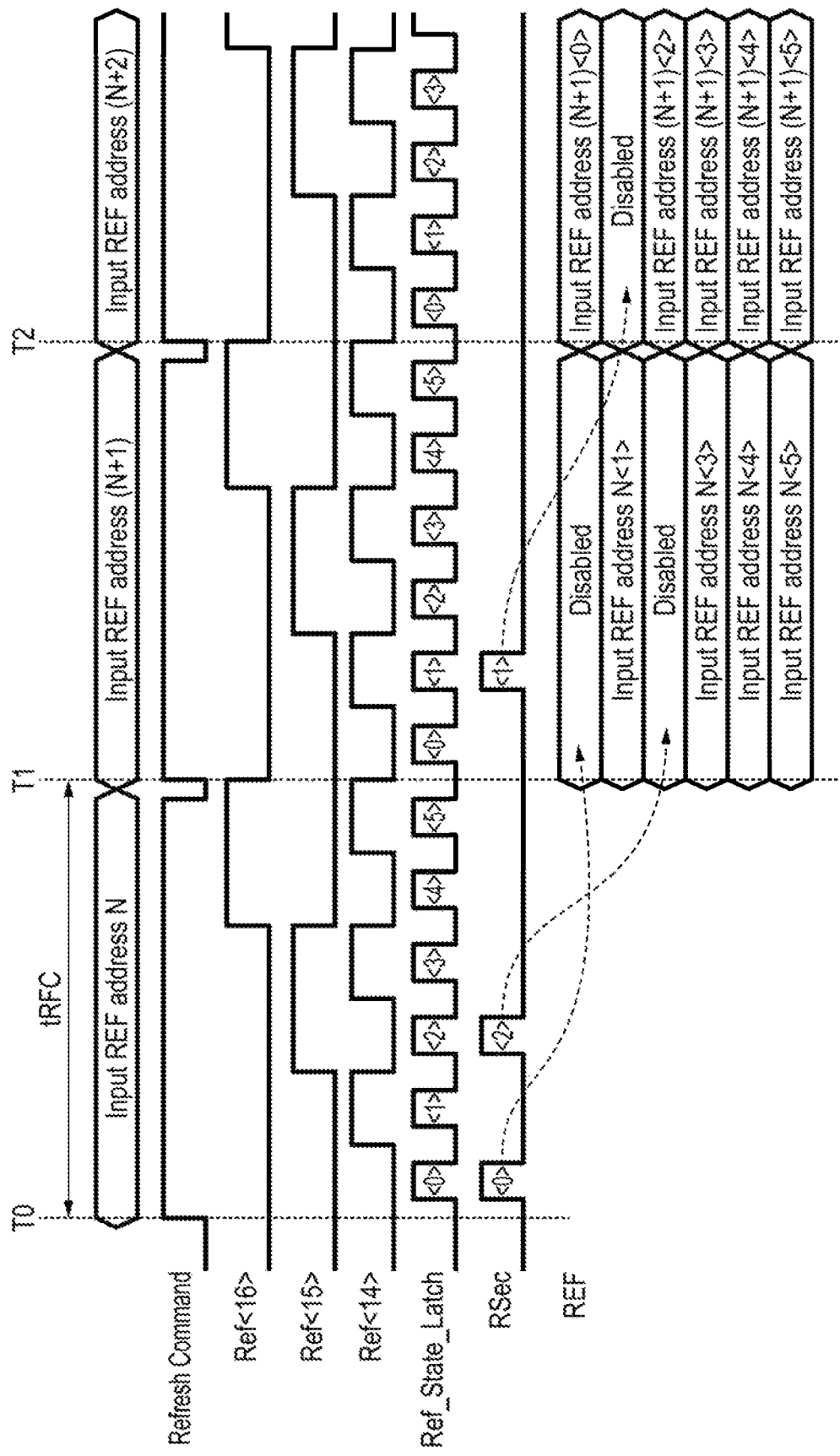
FIG. 12 is a timing diagram of refresh operations according to an embodiment of the disclosure.

Operation of the refresh control circuit 400 for refresh operations will be described with reference to FIG. 12. FIG. 12 is a timing diagram for refresh operations according to an embodiment of the disclosure. The refresh operations of FIG. 12 may be controlled by the refresh control circuit 400 of FIG. 9 in some embodiments of the disclosure.

FIG. 12 illustrates active refresh commands (e.g., AREF) provided to the refresh control circuit 400, the Ref<16>, Ref<15> and Ref<14> address provided by the counter circuit 436, the Ref_State_Latch signal provided by the oscillator circuit 434, and the RSec flag provided by the latch circuit 438. The RRef_State signal provided by the AND gate circuit 410 is a first logic level, indicating to the address predecoder circuit 416 feat the refresh address provided are for memory locations of the regular array.

At time T0 a first active refresh command causes a refresh address N to be input. The refresh address N is provided by the refresh address counter circuit 220 to be latched by the latch circuit 420. The refresh address N is provided by the latch circuit 420 to the selector circuit 422 as the Rai address. The first active refresh command also enables the oscillator circuit 434 to provide the Refclk signal to the counter circuit 436 and to provide the Ref_State_Latch signal to the latch circuit 438.

As previously described with reference to FIG. 9, the Refclk signal is an oscillating signal that causes the counter circuit 436 to increment the 3-bit count Ref<16, 15, 14> from 000 to 101 (i.e., from 0 to 5) before returning to 000 to start incrementing again. The incrementing Ref<16>, Ref<15>, and Ref<14> count is shown in FIG. 12, incrementing from 000, through 001, 010, 011, 100, and 101 before returning to 000. The Ref<16,15,14> count is provided to the selector circuit 422 to be combined with 14-bits of the latched refresh address (provided as the Rai address) from the latch circuit 420 to provide a 17-bit refresh address. For example, Rai<13:0> (14-bits) is combined wife the Ref<16, 15,14> count by the selector circuit 422 for refresh operations to provide a 17-bit refresh address. Incrementing the Ref<16,15,14> count from 000 to 101 provides six different 17-bit refresh addresses related to one 14-bit refresh address provided by the refresh address counter circuit 220.

The 17-bit refresh address from the selector circuit 422 is provided to the redundancy circuit 424, which compares the 17-bit refresh address with memory addresses stored by the redundancy circuit 424. The redundancy circuit 424 provides redundancy information having a logic value that indicates whether there is a match between a current 17-bit refresh address and a stored memory address. For example, the redundancy circuit 424 provides high logic level redundancy information when there is a match between the current 17-bit refresh address and a stored memory address, and provides low logic level redundancy information when there is not a match. As the Ref<16, 15,14> count changes, each new resulting 17-bit refresh address is provided to and compared by the redundancy circuit 424 to provide respective redundancy information for each 17-bit refresh address. In this manner, the refresh addresses provided to the redundancy circuit 424 are determined one by one whether it matches a stored memory address (e.g., corresponds to defective memory and has been mapped to redundant memory).

The redundancy information is latched by the latch circuit 438 responsive to the Ref_State_Latch signal, which is an oscillating signal provided by the enabled oscillator circuit 434. The oscillating Ref_State_Latch signal is shown in FIG. 12 and the positive pulses of the Ref_State_Latch signal are identified by a value corresponding to the Ref<16, 15,14> count (e.g., <0>, <1>, <2>, <3>, <4>, and <5>. As a result, the latch circuit 438 latches the redundancy information for each different 17-bit refresh address provided to the redundancy circuit 424. The latch circuit 438 provides the latched redundancy information for each 17-bit refresh address as the RSec flag through the selector circuit 426 to the address predecoder circuit 416.

In the example of FIG. 12, the 17-bit refresh address for [refresh address N+Ref<16, 15, 14> of 000] is determined by the redundancy circuit 424 to match a stored memory address, as indicated by the high logic level RSec flag corresponding to pulse <0> of the Ref_State_Latch. The Ref<16,15,14> count increments to 001 responsive to the Refclk signal provided by the oscillator circuit 434 to provide a new refresh address for comparison by the redundancy circuit 424. The 17-bit refresh address for [refresh address N+Ref<16, 15, 14> of 001] is determined by the redundancy circuit 424 to not match a stored memory address, as indicated by the low logic level RSec flag corresponding to pulse <1> of the Ref_State_Latch. The Ref<16, 15, 14> count increments again responsive to the Refclk signal to 010 to provide a new refresh address to the redundancy circuit 424. The 17-bit refresh address for [refresh address N+Ref<16, 15, 14> of 010] is determined by the redundancy circuit 424 to match a stored memory address, as indicated by the high logic level RSec flag corresponding to pulse <2> of the Ref_State_Latch. The incrementing of the Ref<16, 15, 14> count and the comparison of the resulting 17-bit address with stored memory addresses by the redundancy circuit 424 continues for the refresh addresses [refresh address N+Ref<16, 15, 14> of 011], [refresh address N+Ref<16, 15, 14> of 100] and [refresh address N+Ref<16, 15, 14> of 101].

In summary for the example of FIG. 12, the refresh addresses [refresh address N+Ref<16, 15, 14> of 000] and [refresh address N+Ref<16, 15, 14> of 010] are determined by the redundancy circuit 424 to match a stored memory address, whereas the refresh addresses [refresh address N+Ref<16, 15, 14> of 001], [refresh address N+Ref<16, 15, 14> of 011], [refresh address N+Ref<16, 15, 14> of 100], and [refresh address N+Ref<16, 15, 14> of 101] are determined by the redundancy circuit 424 to not match any of the stored memory addresses.

As previously described, the corresponding RSec flags for the refresh addresses are provided to the address predecoder circuit 416. The address predecoder circuit 416 controls whether a refresh operation is performed or skipped for a refresh address provided by the latch circuit 414 based on the RSec flag. For example, the address predecoder circuit 416 causes a refresh operation to be performed for the refresh address provided by the latch circuit 414 when the RSec flag is a low logic level (e.g., there is not a match). In contrast, the address predecoder circuit 416 causes a refresh operation to be skipped for the refresh address provided by the latch circuit 414 when the RSec flag is a high logic level (e.g., there is a match). In this manner, memory locations corresponding to the refresh address resulting from the combination of the refresh address provided by the latch circuit 414 and the Ref<16, 15, 14> count are refreshed when they are used (e.g., the refresh address does not match a stored memory address), but are not refreshed when the memory locations are not used (e.g., the memory locations are defective and the memory address corresponding to the defective memory locations is mapped to memory locations in redundant memory).

As also previously described, the oscillator circuit 434 provides a positive Count_End pulse to the latch circuit 432 every six oscillations of the Refclk signal (or the Ref_State_Latch signal). The Count_End pulse causes the latch circuit 432 to latch the Rai address (e.g., the current refresh address from the refresh address counter circuit 220) and provide the latched refresh address to the latch circuit 414 through the selector circuit 412.

In the example of FIG. 12, the oscillator circuit 434 provides the Count_End pulse (not shown) to cause the latch circuit 432 to latch the refresh address N (which is provided by the latch circuit 420 as the Rai address) and provide the latched refresh address N to the latch circuit 414 through the selector circuit 412 prior to a subsequent active refresh command at time T1. For example, in some embodiments of the disclosure, the Count_End pulse is provided at the sixth pulse of the Refclk signal provided to the counter circuit 436. As a result, the Count_End pulse may be provided by the oscillator circuit 434 corresponding to when the Ref<16, 15, 14> count is about to roll over from 101 to 000. In other embodiments of the disclosure, the Count_End pulse may be provided at a different time after the refresh address N has been latched by the latch circuit 420 and before the subsequent active refresh command at time T1.

To summarize, following time T0 and prior to time T1, the six refresh addresses resulting from the combination of refresh address N and the Ref<16, 15, 14> count have been compared with stored memory addresses by the redundancy circuit 424 to provide redundancy information for each of the six refresh addresses associated with the refresh address N. The redundancy information for each of the six refresh addresses associated with the refresh address N and sequentially latched by the latch circuit 438 and provided to the address predecoder circuit 416 as six RSec flags. Additionally, the refresh address N is latched by the latch circuit 432 and provided to the latch circuit 414, and the first active refresh command becomes inactive.

At time T1, a second active refresh command is provided. The second active refresh command causes the latch circuit 414 to latch the refresh address N (provided by the latch circuit 432 through the selector circuit 412) and provide the latched refresh address N to the address predecoder circuit 416. Based on the RSec flags for the six addresses associated with the refresh address N provided to the address predecoder circuit 416 between times T0 and T1, the address predecoder circuit 416 causes refresh operations to be performed for the refresh addresses having a low logic level RSec flag and causes refresh operations to be skipped for the refresh addresses having a high logic RSec flag. In this manner, refresh operations for the refresh addresses associated with the refresh address N are performed after preparations for the refresh operations are completed (e.g., preparation between times T0 and T1), and the refresh operations may be performed between times T1 and T2. Additionally, refresh operations for refresh addresses that correspond to memory locations that are not used (e.g., defective memory locations that have been remapped to redundant memory) are skipped. In the example of FIG. 12, refresh operations for refresh addresses [refresh address N+Ref<16, 15, 14> of 001] and [refresh address N+Ref<16, 15, 14> of 011] through [refresh address N+Ref<16, 15, 14> of 101] are performed and refresh operations for refresh addresses [refresh address N+Ref<16, 15,14> of 000] and [refresh address N+Ref<16, 15, 14> of 010] are skipped.

In some embodiments of the disclosure, refresh operations for the memory locations of the refresh addresses (that are not skipped) are performed concurrently. For example, the memory locations of refresh addresses [refresh address N+Ref<16, 15, 14> of 001] and [refresh address N+Ref<16, 15, 14> of 011] through [refresh address N+Ref<16, 15, 14> of 101] are performed concurrently. In some embodiments of the disclosure, the memory locations of the refresh addresses (that are not skipped) are performed sequentially. For example, the memory locations of refresh address [refresh address N+Ref<16,15,14> of 001] are refreshed, and then the memory locations of refresh address [refresh address N+Ref<16, 15, 14> of 011] are refreshed, and then the memory locations of refresh address [refresh address N+Ref<16, 15, 14> of 100] are refreshed, and so on. In some embodiments of the disclosure, the refresh operations for the memory locations of the refresh addresses (that are not skipped) are started at different times, but overlap. The manner in which the memory locations of refresh addresses related to a base refresh address is not intended to limit the scope of the disclosure.

Also at time T1 the second active refresh command causes the refresh address counter circuit 220 to provide a refresh address (N+1) to be input. The preparations for refresh operations previously described for the refresh address N that were performed between times T0 and T1 are repeated for the refresh address (N+1) between times T1 and T2. For example, between times T1 and T2, the six refresh addresses resulting from the combination of refresh address (N+1) and the Ref<16, 15, 14> count are compared with stored memory addresses by the redundancy circuit 424 to provide redundancy information for each of the six refresh addresses associated with the refresh address (N+1). The redundancy information for each of the six refresh addresses associated with the refresh address (N+1) are sequentially latched by the latch circuit 438 and provided to the address predecoder circuit 416 as six RSec flags. Additionally, the refresh address (N+1) is latched by the latch circuit 432 and provided to the latch circuit 414, and the second active refresh command becomes inactive. In the example of FIG. 12, the refresh addresses [refresh address (N+1)+Ref<16, 15, 14> of 001] is determined by the redundancy circuit 424 to match a stored memory address (as indicated by a high logic level RSec signal corresponding to pulse <1> of the Ref_State_Latch), whereas the refresh addresses [refresh address (N+1)+Ref<16, 15, 14> of 000] and [refresh address (N+1)+Ref<16, 15, 14> of 010] through [refresh address (N+1)+Ref<16, 15, 14> of 101] are determined by the redundancy circuit 424 to not match any of the stored memory addresses (as indicated by low logic level RSec signals corresponding to pulses <0> and <1> through <5> of the Ref_State_Latch).

At time T2, a third active refresh command causes the latch circuit 414 to latch the refresh address (N+1) (provided by the latch circuit 432 through the selector circuit 412) and provide the latched refresh address (N+1) to the address predecoder circuit 416. Based on the RSec flags for the six addresses associated with the refresh address (N+1) provided to the address predecoder circuit 416 between times T1 and T2, the address predecoder circuit 416 causes refresh operations to be performed for the refresh addresses having a low logic level RSec flag and causes refresh operations to be skipped for the refresh addresses having a high logic RSec flag. In this manner, refresh operations for the refresh addresses associated with the refresh address (N+1) are performed after preparations for the refresh operations are completed (e.g., preparation between times T1 and T2), and the refresh operations may be performed between times T2 and T3. Additionally, refresh operations for refresh addresses that correspond to memory locations that are not used (e.g., defective memory locations that have been remapped to redundant memory) are skipped. In the example of FIG. 12, refresh operations for refresh addresses [refresh address (N+1)+Ref<16, 15, 14> of 000], and [refresh address (N+1)+Ref<16, 15, 14> of 010] through [refresh address (N+1)+Ref<16, 15, 14> of 101] are performed and refresh operations for refresh address [refresh address (N+1)+Ref<16, 15, 14> of 001] is skipped.

Also at time T2 the third active refresh command causes the refresh address counter circuit 220 to provide a refresh address (N+2) to be input. The preparations for refresh operations previously described for the refresh addresses N and (N+1) that were performed between times T0 and T1 and between times T1 and T2 are repeated for the refresh address (N+2) following time T2 in anticipation of the refresh operations for the refresh addresses associated with the refresh address (N+2) to be performed after preparations are completed. The refresh operations for the refresh addresses associated with the refresh address (N+2) may be performed responsive to a subsequent active refresh command.

Following the refresh operations for memory locations of the regular array, refresh operations for memory locations of the redundant array are performed, as previously described with reference to FIG. 5. The RRef_State signal from the AND gate circuit 410 changes to a second logic level indicating to the address predecoder circuit 416 that the refresh address provided are for memory locations of the redundant array. Operation of the refresh control circuit 400 for refresh operations for memory locations of the redundant array are similar to that described for refresh operations for memory locations of the regular array. As a result, refresh operations for memory locations of the redundant array that are not used are skipped, while refresh operations for memory locations of the redundant array that are used (e.g., have a memory address mapped thereto) are performed.

Figure 13:
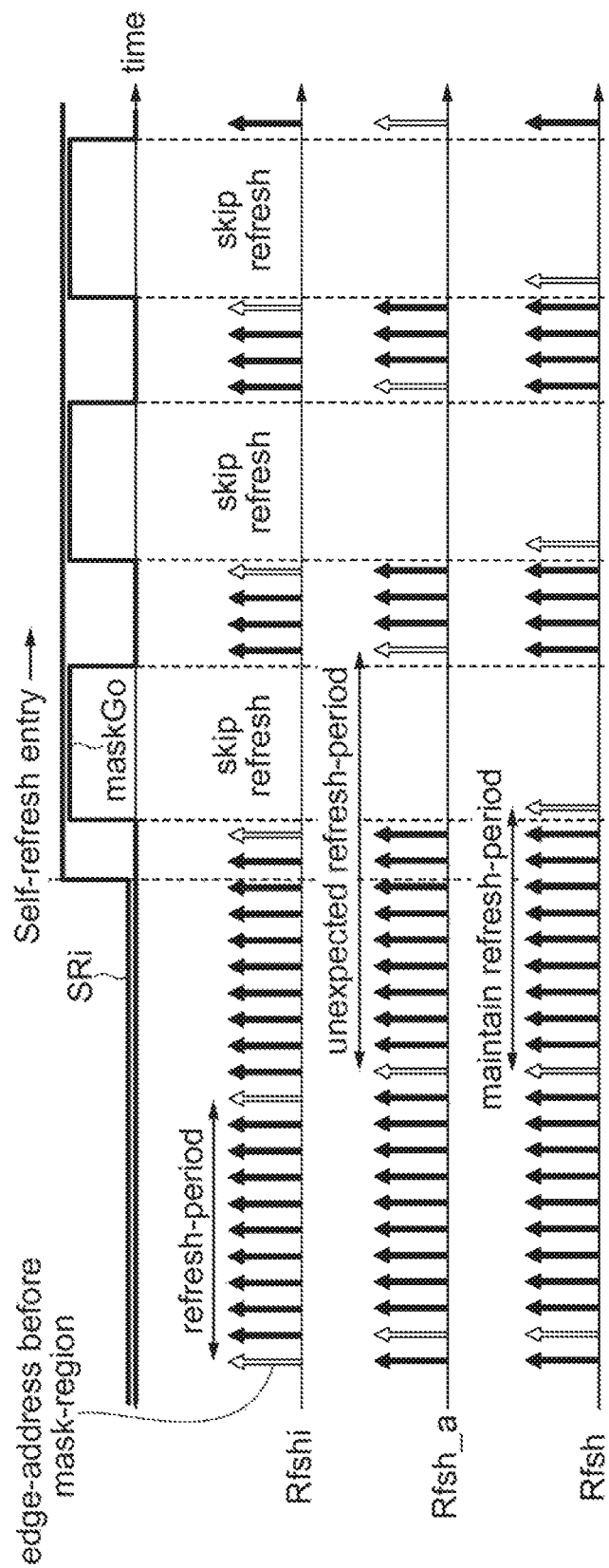
FIGS. 13 and 14 are diagrams of refresh operations according to an embodiment of the disclosure.

FIG. 13 is a timing diagram for explaining a segment mask operation. A refresh slate signal Rfsh_a shown in FIG. 13 is a waveform of a refresh state signal Rfsh according to a comparative example obtained when the flip-flop circuit 225 is not used. Among the refresh state signals Rfshi, Rfsh_a, and Rfsh, signals indicated by whiteout arrows are refresh state signals corresponding to an edge-address before a mask region. As shown in FIG. 13, when the semiconductor device 100 enters a self-refresh mode, the refresh state signal Rfsh is masked each time the determination signal maskGO is activated at a high level. In a case where the flip-flop circuit 225 is not used as in the comparative example, the refresh state signal Rfsh is masked right after the determination signal maskGO is activated at a high level, and thus the edge-address before the mask region is not refreshed until the determination signal maskGO is shifted to a low level, and the refresh period becomes long. On the other hand, in the present embodiment, the flip-flop circuit 225 is provided in the mask control circuit 240, and a segment mask process is performed after one cycle since the determination signal maskGO is activated at a high level. Therefore, the edge-address before the mask region is refreshed promptly.

Figure 14:
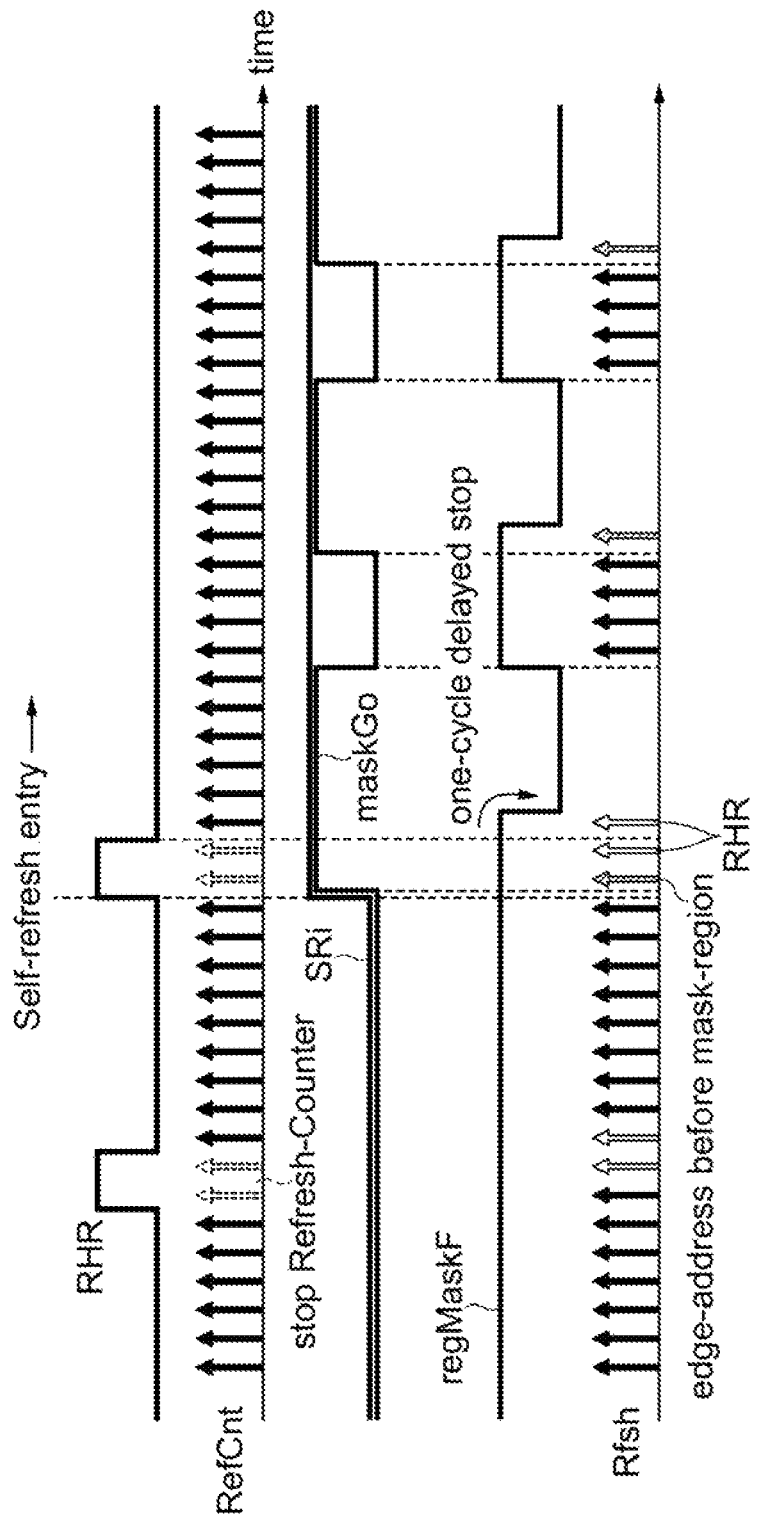

FIG. 14 is a timing diagram for explaining operations in a case where a refresh address is included in a mask region at a time point where the semiconductor device 100 enters a self-refresh mode and the row hammer refresh signal RHR is activated. Among the refresh state signals Rfsh, signals indicated by whiteout arrows are refresh state signals corresponding to an edge-address before a mask region. Among the refresh suite signals Rfsh, signals indicated by stripe arrows are refresh state signals corresponding to a row hammer refresh operation. When the row hammer refresh signal RHR is activated, an incrementing operation by the refresh counter 220 is stopped and a masking operation of the refresh state signal Rfsh is temporarily stopped. Therefore, in a case where a refresh address is included in the mask region at a time point where the semiconductor device 100 enters a self-refresh mode and the row hammer refresh signal RHR is activated as shown in FIG. 14, a segment mask process is performed after three cycles since the determination signal maskGO is activated at a high level. Therefore, the edge-address before the mask region is refreshed promptly, and a row hammer refresh operation is performed correctly without the address being masked.

As described for various embodiments of the disclosure, refresh addresses may be determined to be mapped to redundant memory (e.g., when the corresponding memory locations in the regular array are defective) one by one, and refresh operations for memory locations of the regular array and the redundant array that are not used (e.g., are defective and have a corresponding memory address remapped to redundant memory) may be skipped, while refresh operations for memory locations of the regular array and the redundant array that are used are performed. Thus, unnecessary refresh operations to memory locations that are not used may be avoided.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

The invention claimed is:

1. A method, comprising:
    updating a refresh address responsive to a refresh command;
    refreshing memory for the refresh address when the refresh address is directed to a regular array;
    skipping refresh of memory for the refresh address in the regular array when the refresh address is directed to a redundant array; refreshing memory of the redundant array to which the refresh address is directed; and
    generating a row hammer refresh address, interrupting the refreshing of the regular array and performing a refresh operation on the row hammer refresh address.

2. The method of claim 1, further comprising skipping refreshing of unused memory of the redundant array.

3. The method of claim 2 wherein refreshing the memory of the redundant array to which the refresh address is directed is performed after refreshing memory for an updated refresh address directed to the regular array.

4. The method of claim 1, further comprising skipping refresh of memory for the row hammer refresh address in the regular array when the row hammer refresh address is directed to the redundant array.

5. The method of claim 4, further comprising skipping refresh of memory for the row hammer refresh address in the regular array when the row hammer refresh address is directed to an unused address in the redundant array.

6. The method of claim 1, further comprising:
    latching the refresh address responsive to the refresh command; and
    performing a refresh operation on the refresh address responsive to a second occurrence of the refresh command.

* * * * *